(12) United States Patent
Yu et al.

(10) Patent No.: US 12,046,644 B2
(45) Date of Patent: *Jul. 23, 2024

(54) GAP SPACER FOR BACKSIDE CONTACT STRUCTURE

(71) Applicant: Taiwan Semiconductor Manufacturing Company, Ltd., Hsinchu (TW)

(72) Inventors: Li-Zhen Yu, Hsinchu (TW); Lin-Yu Huang, Hsinchu (TW); Kuan-Lun Cheng, Hsin-Chu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 91 days.

This patent is subject to a terminal disclaimer.

(21) Appl. No.: 17/810,425

(22) Filed: Jul. 1, 2022

(65) Prior Publication Data

US 2022/0336599 A1 Oct. 20, 2022

Related U.S. Application Data

(63) Continuation of application No. 17/103,463, filed on Nov. 24, 2020, now Pat. No. 11,424,332.

(51) Int. Cl.
*H01L 29/417* (2006.01)
*H01L 21/762* (2006.01)
(Continued)

(52) U.S. Cl.
CPC .... *H01L 29/41733* (2013.01); *H01L 21/7624* (2013.01); *H01L 21/7682* (2013.01);
(Continued)

(58) Field of Classification Search
CPC .......... H01L 29/41733; H01L 21/7624; H01L 21/7682; H01L 21/76831; H01L 21/76832;
(Continued)

(56) References Cited

U.S. PATENT DOCUMENTS 11,424,332 B2 * 8/2022 Yu ..................... H01L 29/66787
2021/0359091 A1 * 11/2021 Hsu ................. H01L 21/823418

OTHER PUBLICATIONS

Liao, Yi-Bo, et al., "Source/Drain Contact Structure", U.S. Appl. No. 17/093,230, filed Nov. 9, 2020, Assignee: Taiwan Semiconductor Manufacturing Co., Ltd., 50 pages specification, 57 pages drawings.
(Continued)

*Primary Examiner* — Tong-Ho Kim
(74) *Attorney, Agent, or Firm* — HAYNES AND BOONE, LLP

(57) ABSTRACT

Semiconductor devices and methods of forming the same are provided. A semiconductor device according to the present disclosure include a source feature disposed over a backside source contact, a drain feature disposed over a backside dielectric layer, a plurality of channel members each extending between the source feature and the drain feature, and a gate structure wrapping around each of the plurality of channel members and disposed over the backside dielectric layer. The backside source contact is spaced apart from the backside dielectric layer by a gap.

20 Claims, 29 Drawing Sheets

(51) Int. Cl.
*H01L 21/768* (2006.01)
*H01L 29/66* (2006.01)
*H01L 29/786* (2006.01)
*H01L 29/423* (2006.01)

(52) U.S. Cl.
CPC .. *H01L 21/76831* (2013.01); *H01L 21/76832* (2013.01); *H01L 29/66742* (2013.01); *H01L 29/66787* (2013.01); *H01L 29/78696* (2013.01); *H01L 29/42392* (2013.01)

(58) Field of Classification Search
CPC ......... H01L 29/66742; H01L 29/66787; H01L 29/78696; H01L 29/42392; H01L 2221/1063; H01L 21/76897; H01L 23/5286
USPC ........................................................ 257/288
See application file for complete search history.

(56) References Cited

OTHER PUBLICATIONS

Lung-Kun Chu, et al., "Self-Aligned Backside Source Contact Structure", U.S. Appl. No. 17/016,109, filed Sep. 9, 2020, Assignee: Taiwan Semiconductor Manufacturing Co. Ltd., 31 pages specification, 17 pages drawings.

Huan-Chieh Su, et al., "Backside Power Rail and Methods of Forming the Same", U.S. Appl. No. 16/901,963, Assignee: Taiwan Semiconductor Manufacturing Co., Ltd., 29 pages specification, 22 pages drawings.

Pei-Wei Wang, et al., "Method of Forming Backside Power Rails", U.S. Appl. No. 17/037,274, Assignee: Taiwan Semiconductor Manufacturing Company, Ltd., 29 pages specification, 16 pages drawings.

* cited by examiner

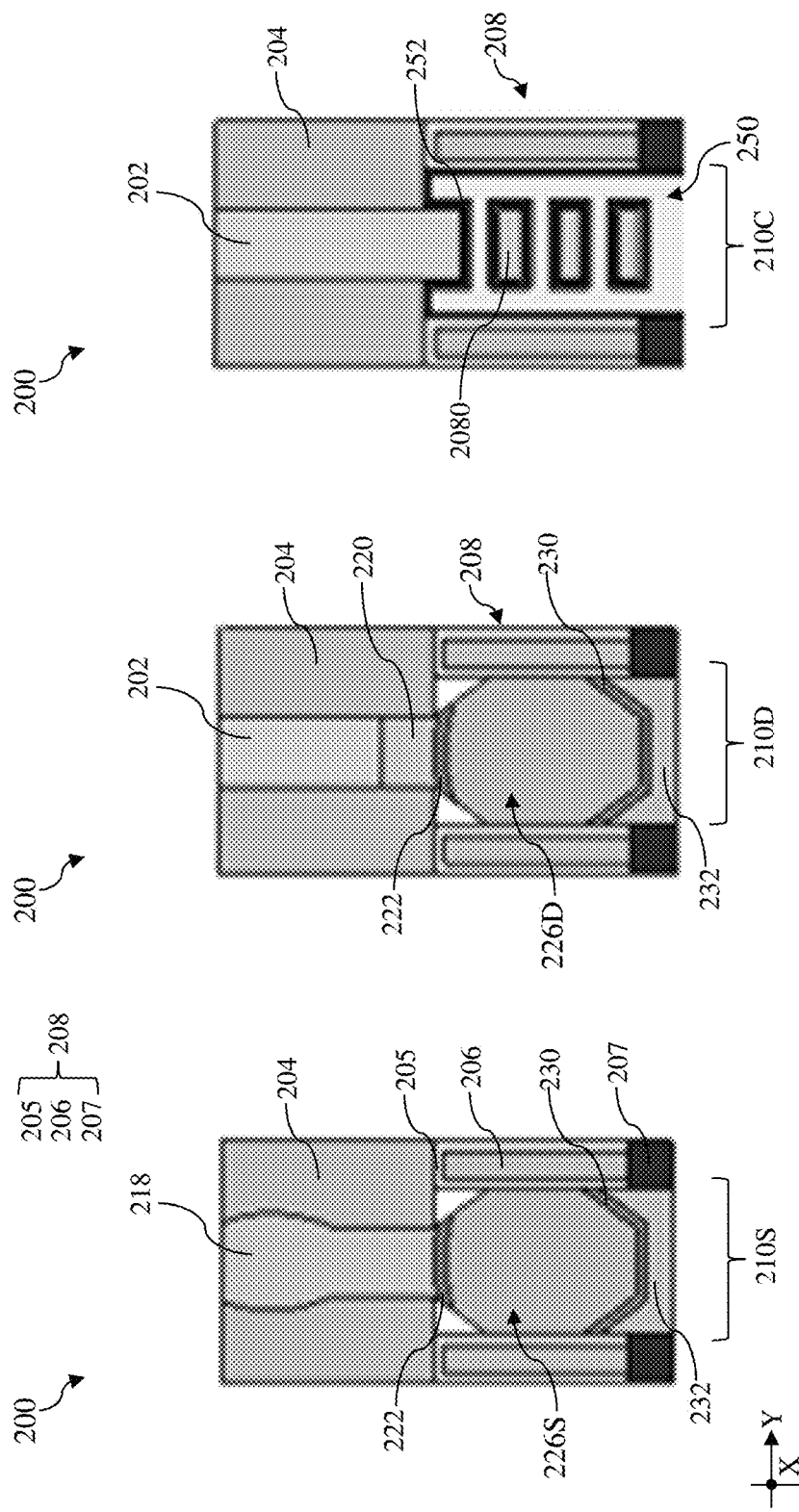

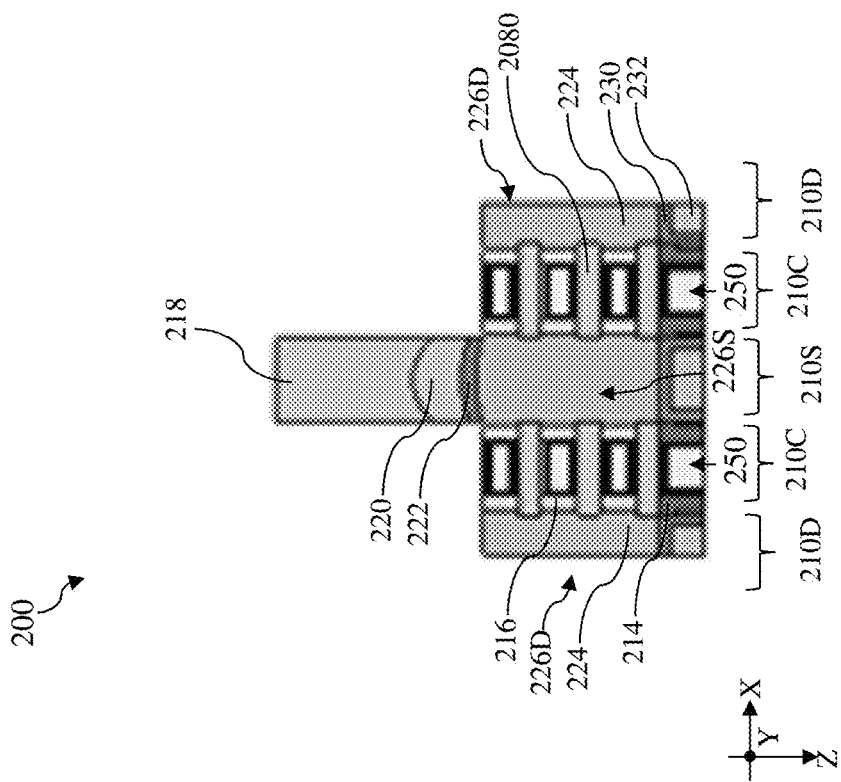

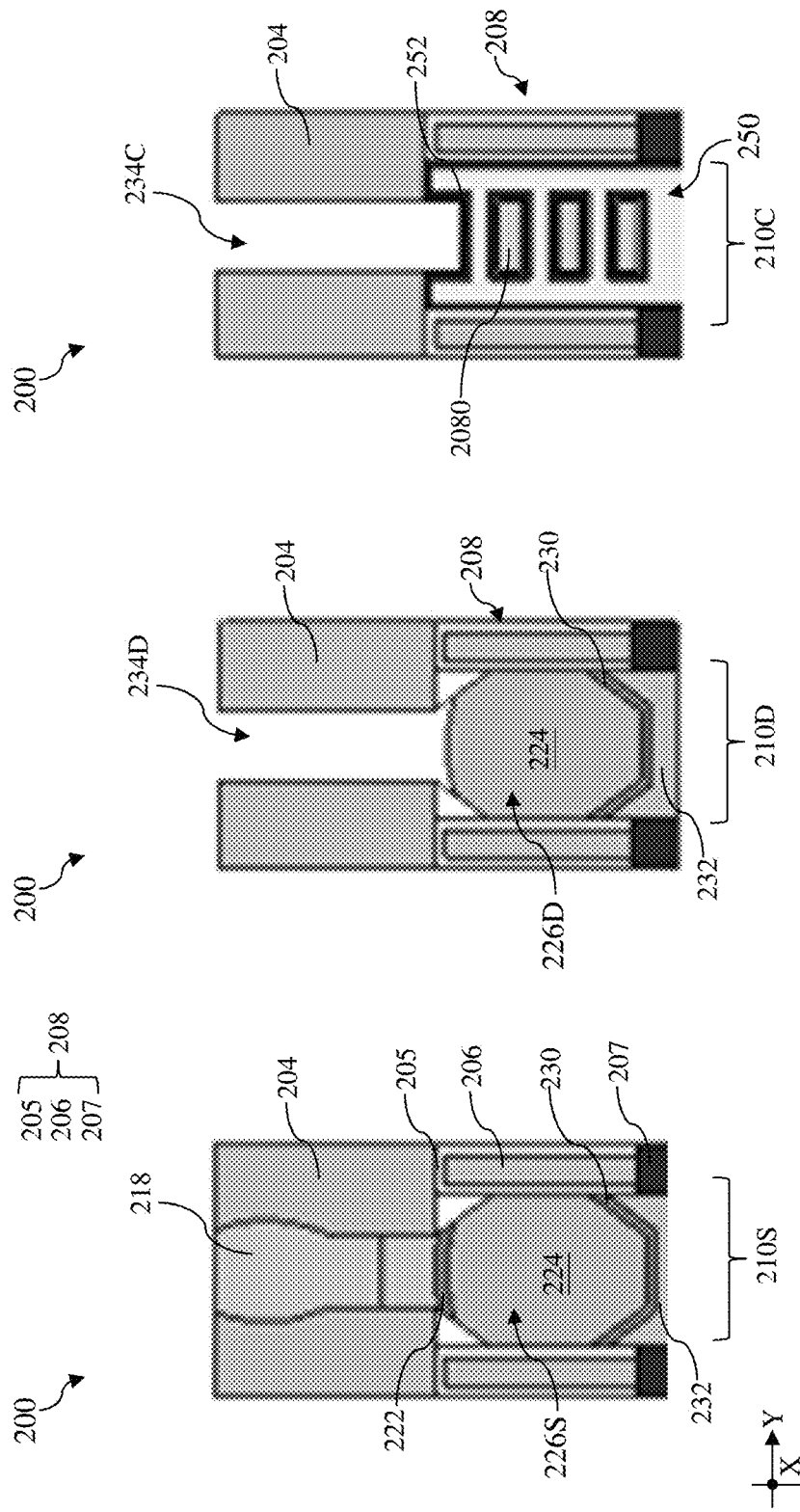

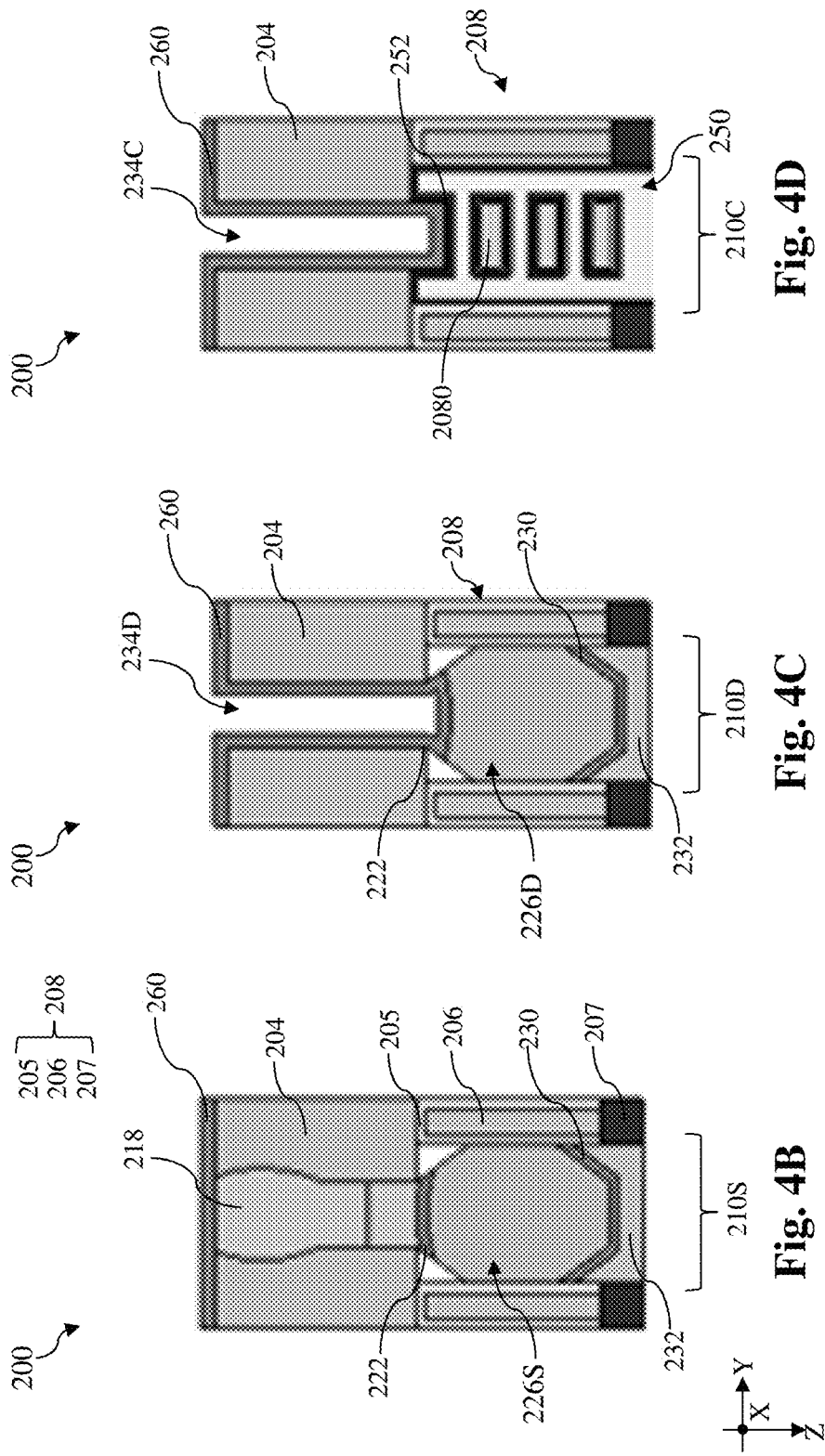

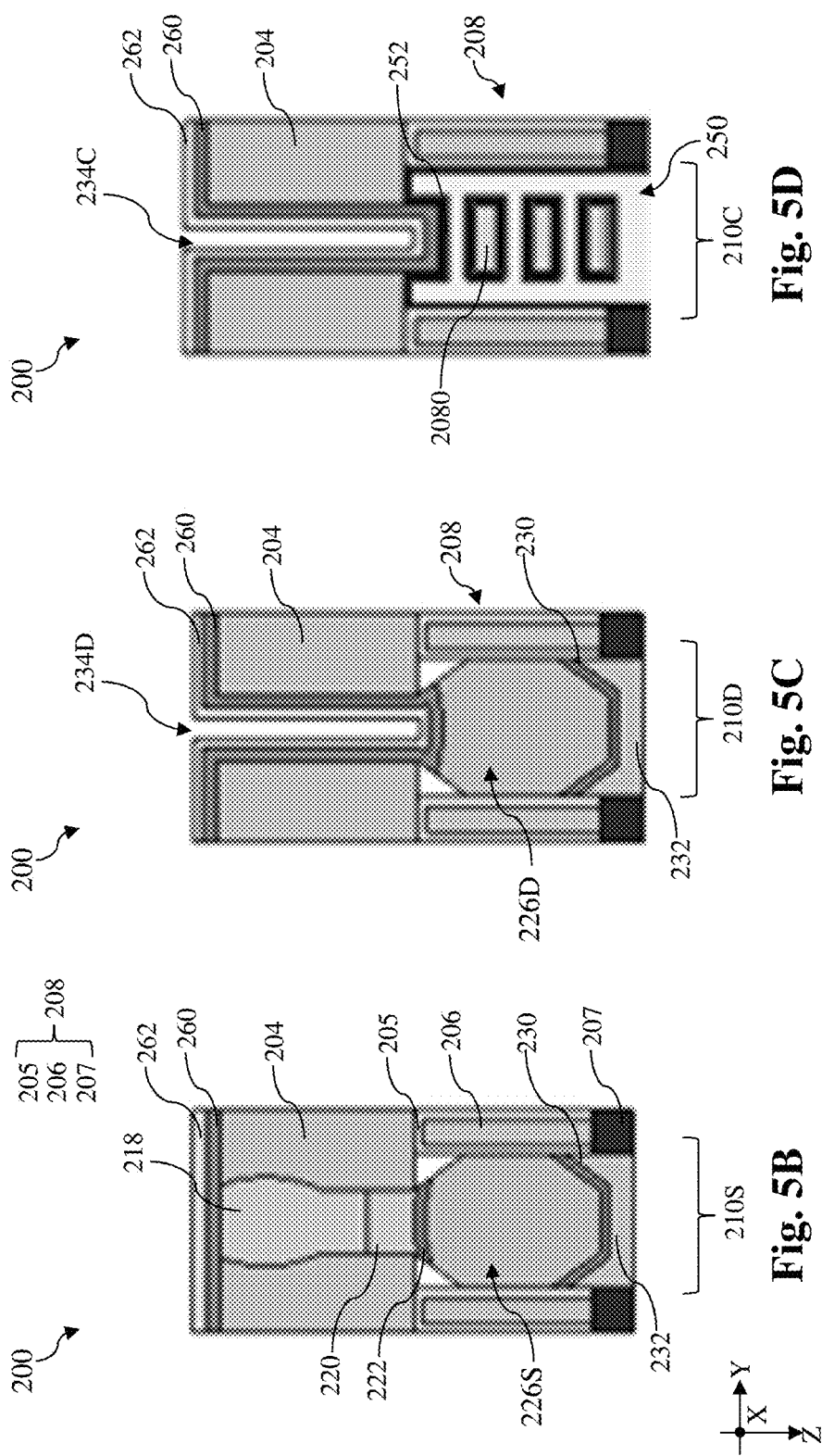

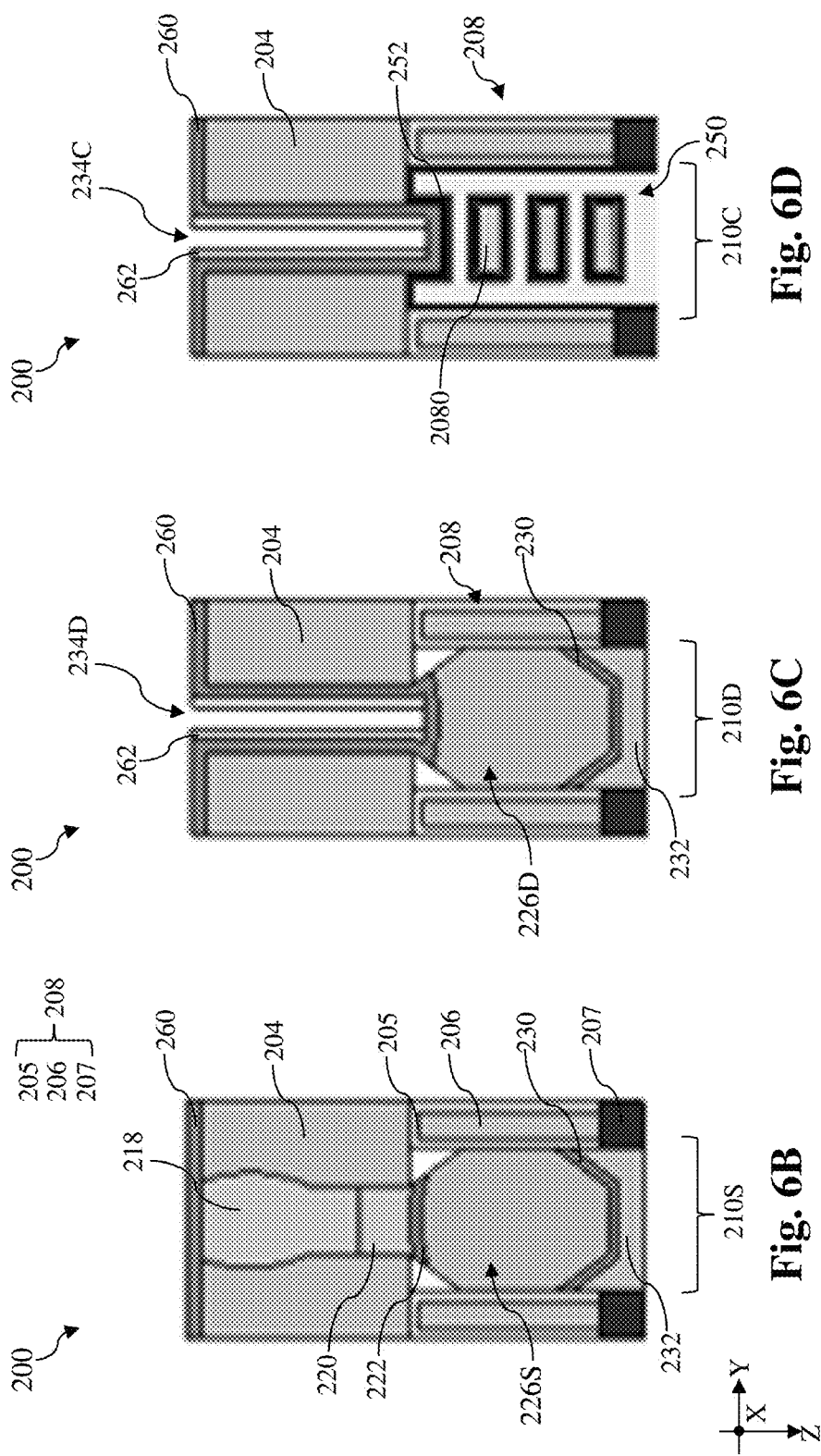

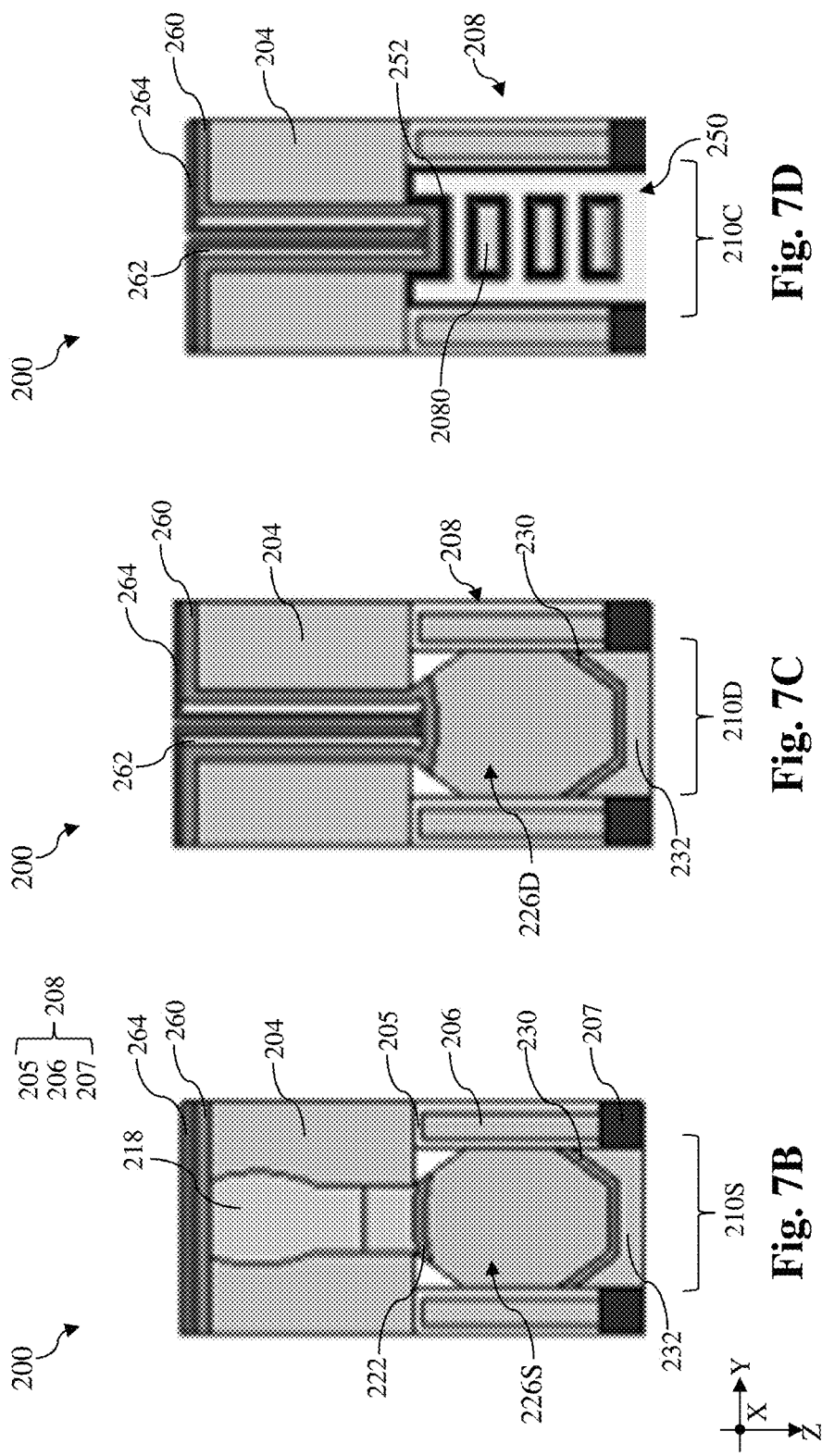

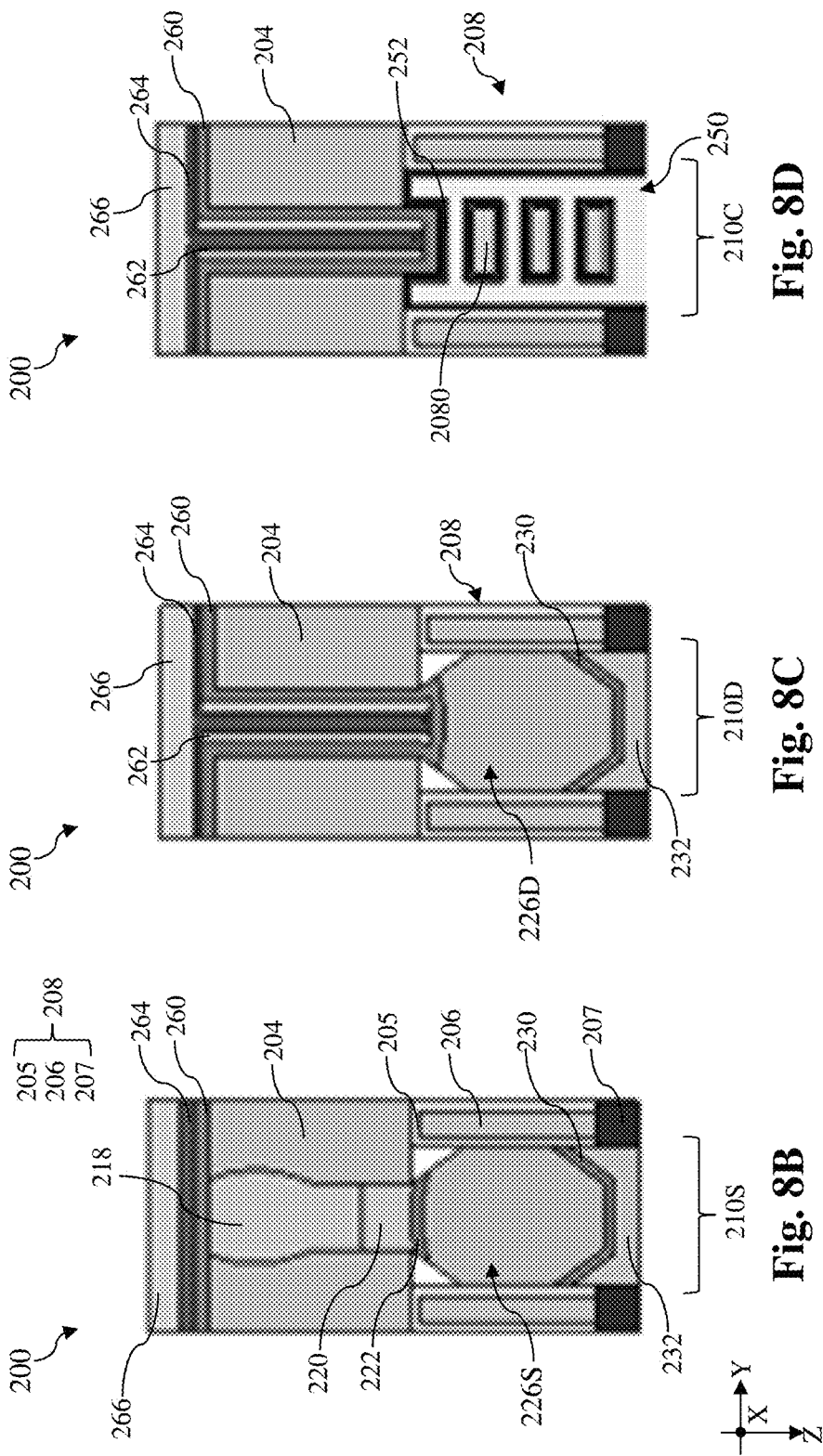

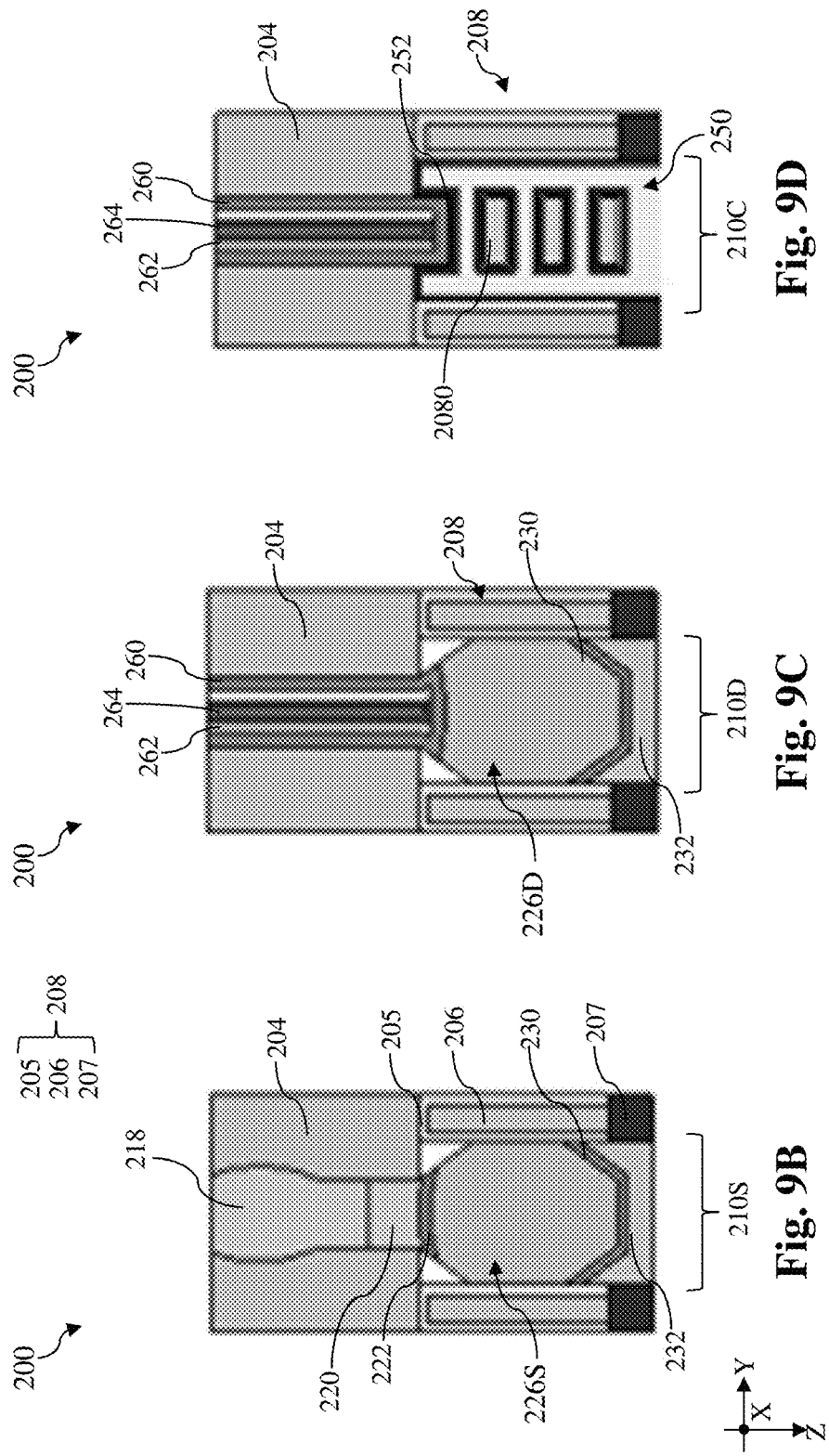

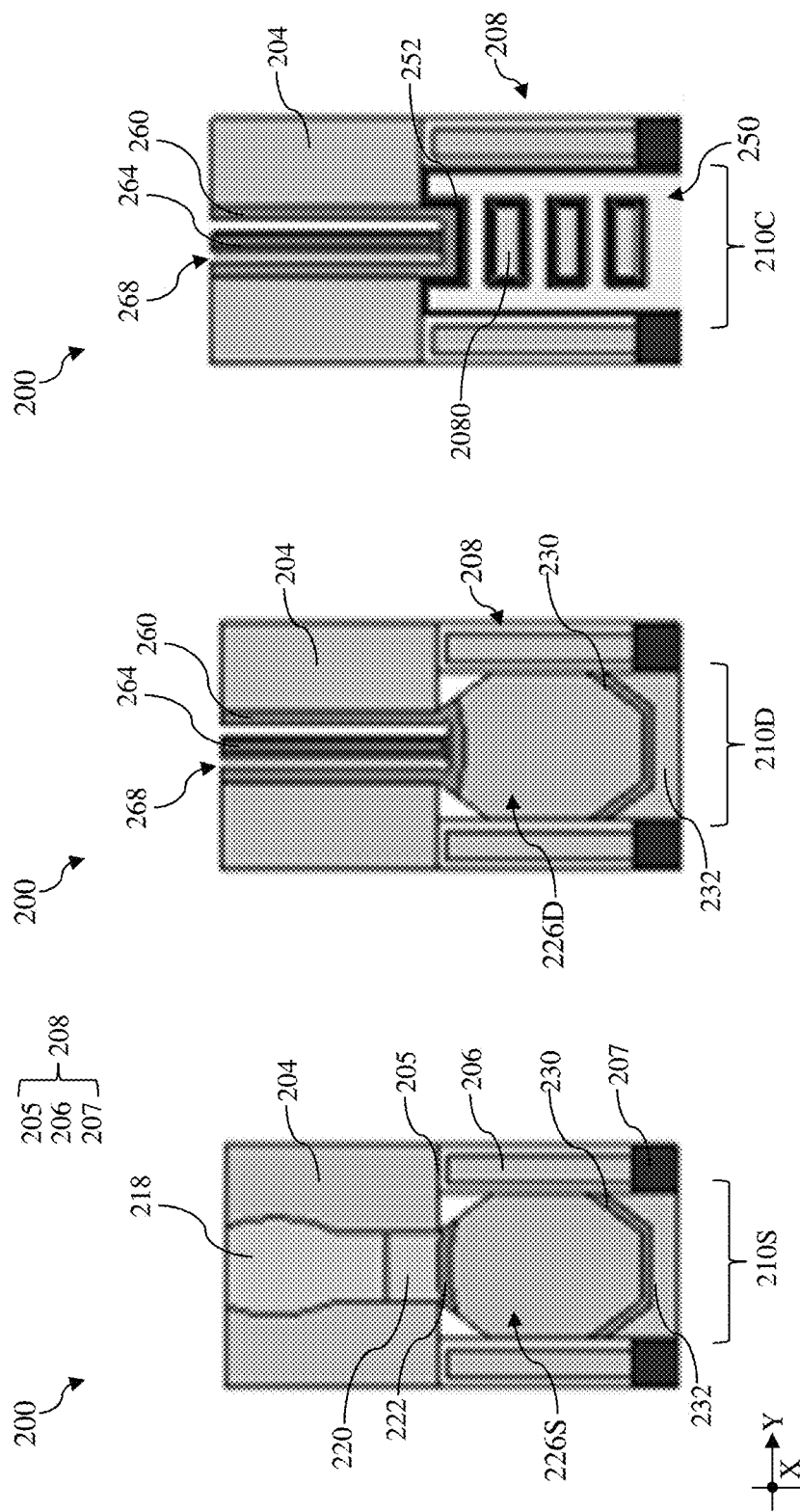

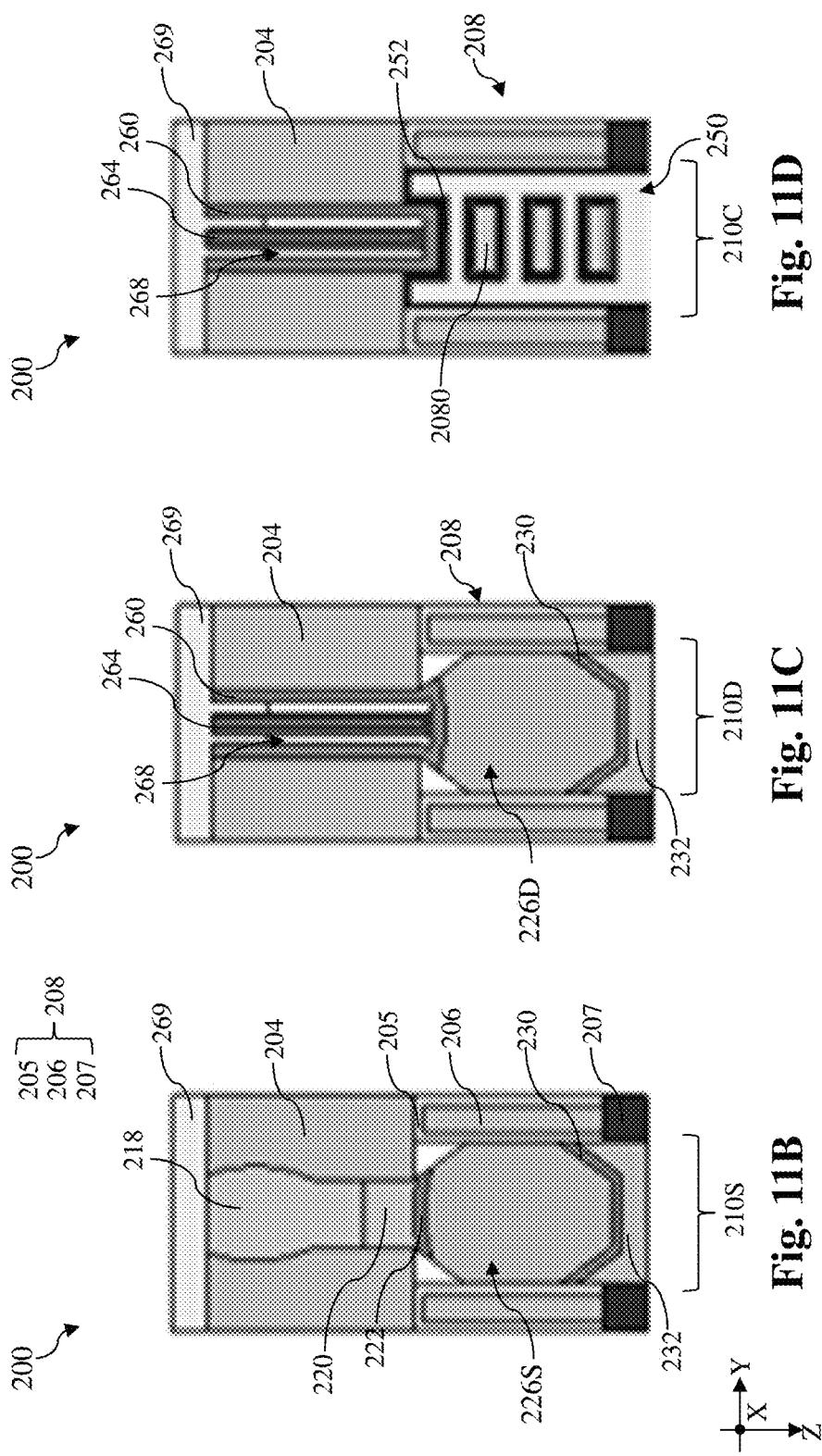

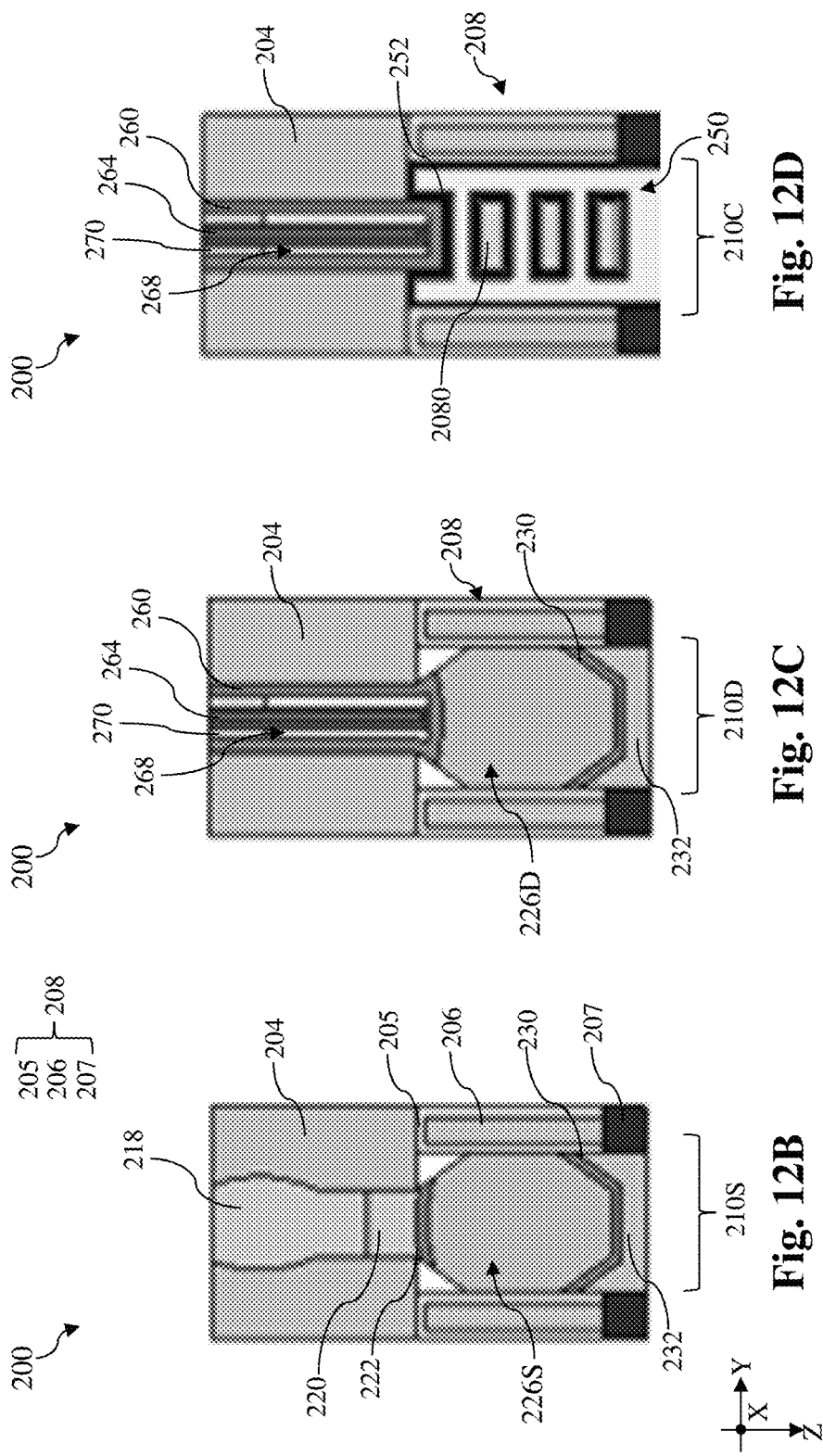

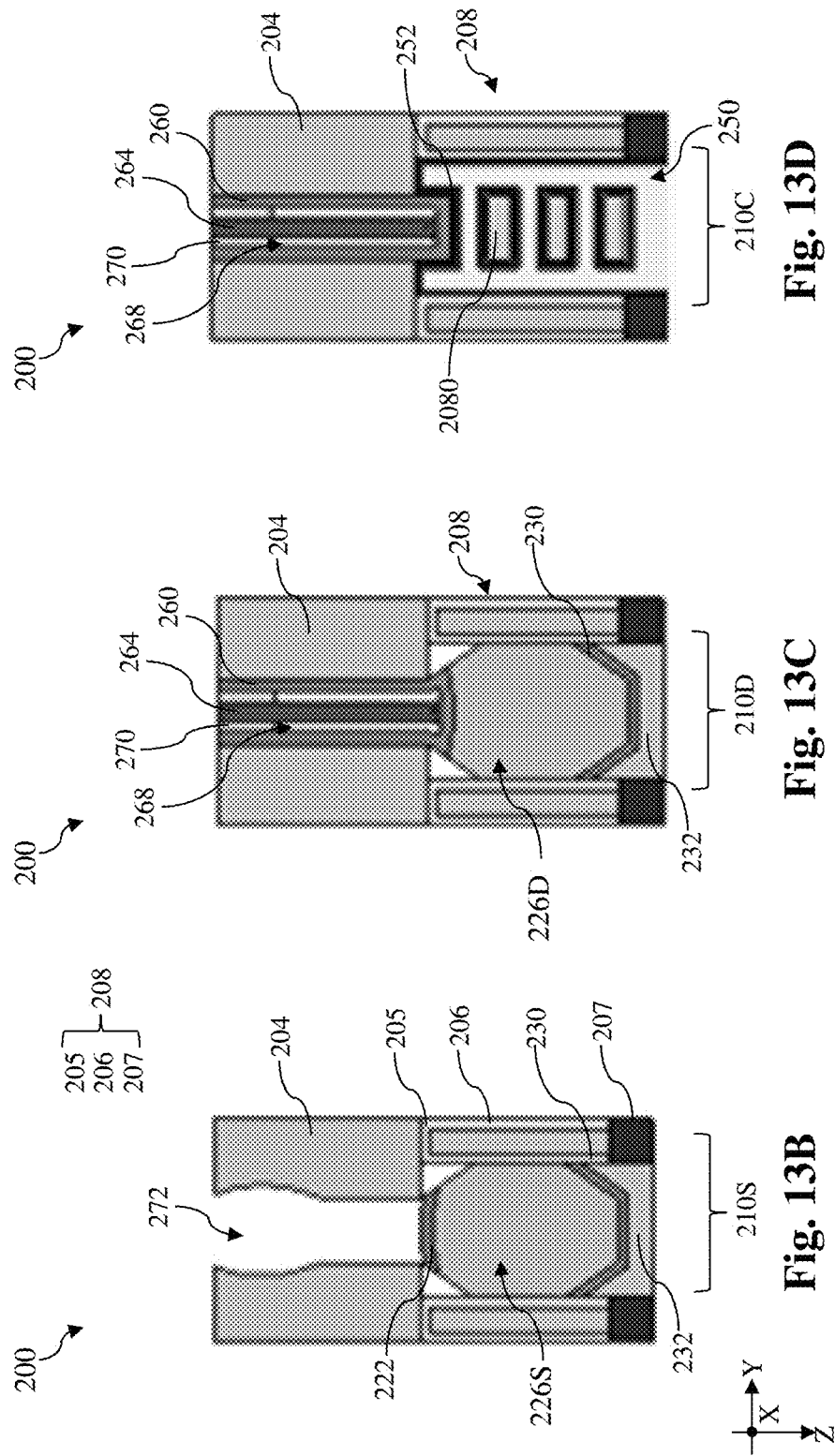

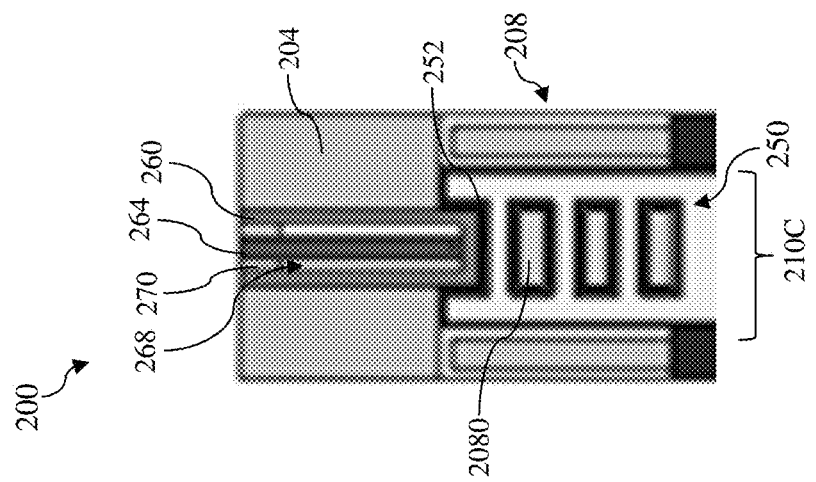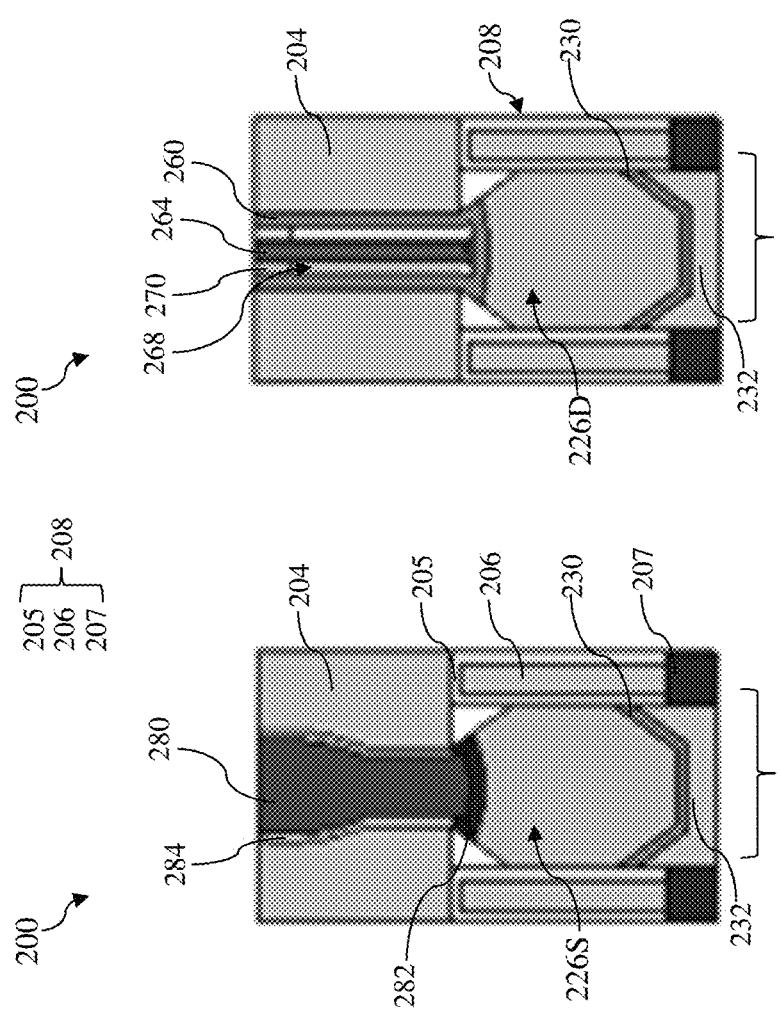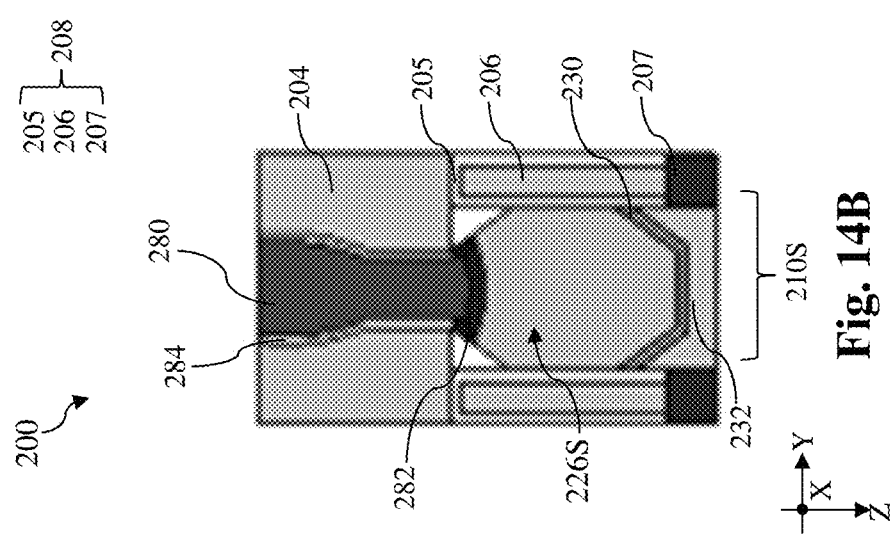

GAP SPACER FOR BACKSIDE CONTACT STRUCTURE

PRIORITY DATA

This application is a continuation of U.S. patent application Ser. No. 17/103,463, filed Nov. 24, 2020, which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As the dimensions of the multi-gate devices shrink, packing all contact features on one side of a substrate is becoming more and more challenging. To ease the packing density, routing features may be moved to a backside of the substrate. Such routing features may include backside power rails or backside contacts. Capacitance between the backside contacts and adjacent gate structures may impact device performance. Therefore, while existing backside power rail formation processes may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 2A-14A, 2B-14B, 2C-14C, 2D-14D, and 15 illustrate fragmentary cross-sectional views of a workpiece during a fabrication process according to the method of FIG. 1, according to one or more aspects of the present disclosure.

DETAILED DESCRIPTION

Figure 1:
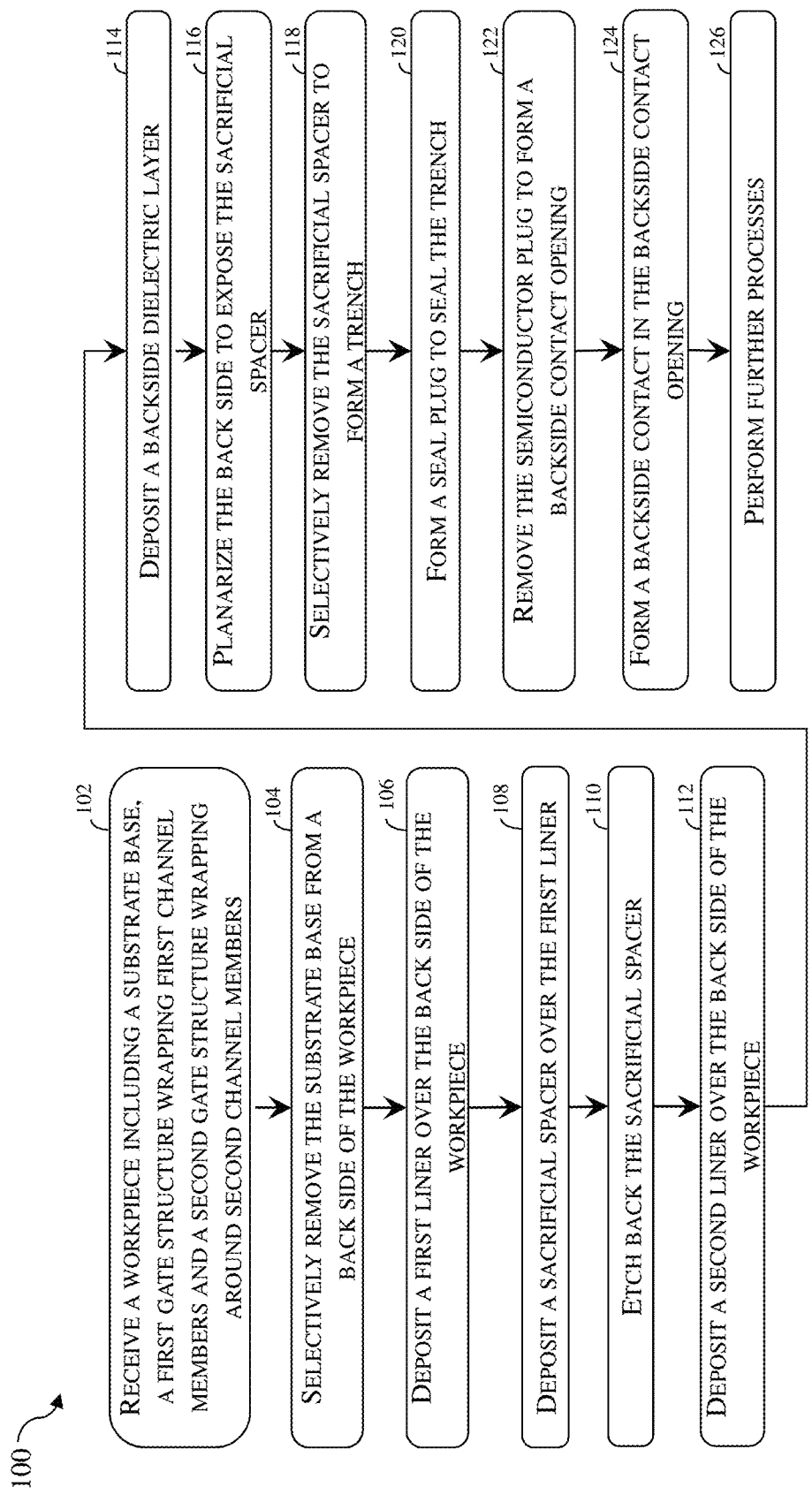
FIG. 1 illustrates a flowchart of a method for forming a semiconductor device having a backside source/drain contact, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to methods of forming a semiconductor device having a backside source/drain contact, and more particularly to methods of forming a backside source/drain contact that is spaced apart from adjacent structures by a gap.

Conventionally, source/drain contacts and gate contacts of transistors on a substrate connect source/drain features of the transistors to an interconnect structure over a front side of the substrate. As the dimensions of IC devices shrink, the close proximity among the source/drain contacts and gate contacts may reduce process windows for forming these contacts and may increase parasitic capacitance among them. The backside power rail (BPR) structure is a modern solution to ease the crowding of contacts. In some contact schemes, backside source/drain contacts may be formed from a back side of the substrate and is coupled to a backside power rail. Due to proximity to adjacent gate structure, parasitic capacitance may exist between the backside source/drain contact and the gate structure. Such parasitic capacitance may impact device performance and reduce switching speed.

The present disclosure provides a method for forming a backside source/drain contact that is spaced apart from adjacent structures by a gap. In an example method, a workpiece is received with its back side facing up. The workpiece includes a first gate structure wrapping around a first plurality of channel members and a second gate structure wrapping around a second plurality of channel members. A source feature disposed between the first plurality of channel members and the second plurality of channel members. With the back side facing up, a semiconductor plug in a substrate is disposed directly over the source feature. After the substrate is selectively removed, a first liner, a sacrificial spacer, a second liner, and a backside dielectric layer are sequentially deposited over the semiconductor plug. A planarization process is then performed to expose the sacrificial spacer and the exposed sacrificial spacer is selectively removed to form a gap. The semiconductor plug is then removed and replaced with a backside source contact. The backside source contact is spaced apart from the backside dielectric layer by the gap. The gap reduces the parasitic capacitance between the backside source contact and the first gate structure and between the backside source contact and the second gate structure.

The various aspects of the present disclosure will now be described in more detail with reference to the figures. In that regard, FIG. 1 is a flowchart illustrating method 100 of forming a semiconductor device according to embodiments of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2A-14A, 2B-14B, 2C-14C, 2D-14D, and 15, which are fragmentary cross-sectional views of a workpiece 200 at different stages of fabrication according to embodiments of method 100. Because the workpiece 200 will be fabricated into a semiconductor device 200 upon conclusion of the fabrication processes, the workpiece 200 may be referred to as the semiconductor device 200 as the context requires. Additionally, throughout the present application, like reference numerals denote like features, unless otherwise excepted.

Figure 2:
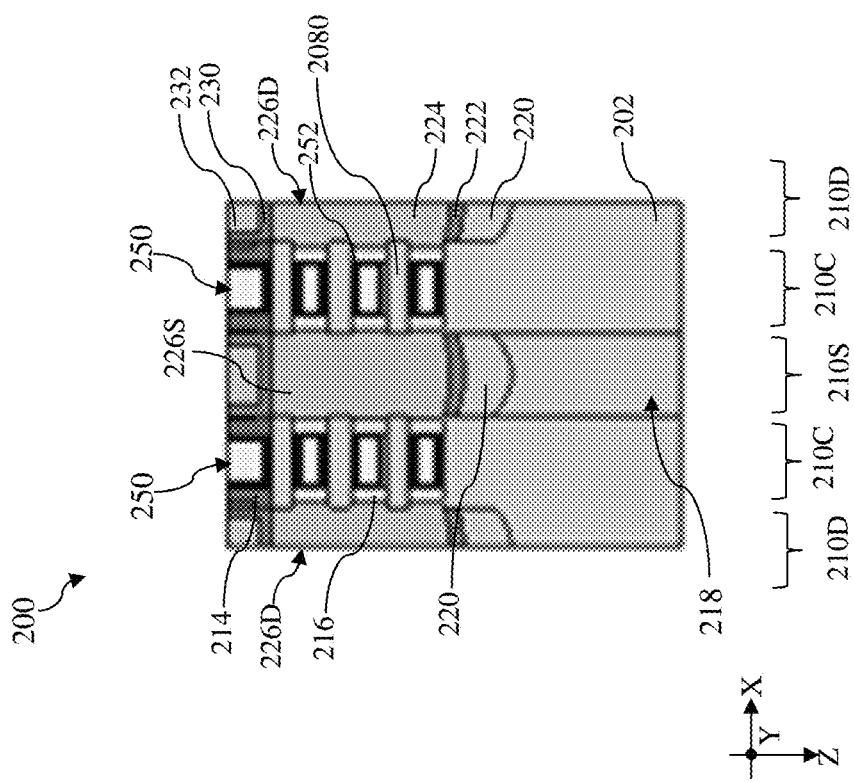
Figure 2A:
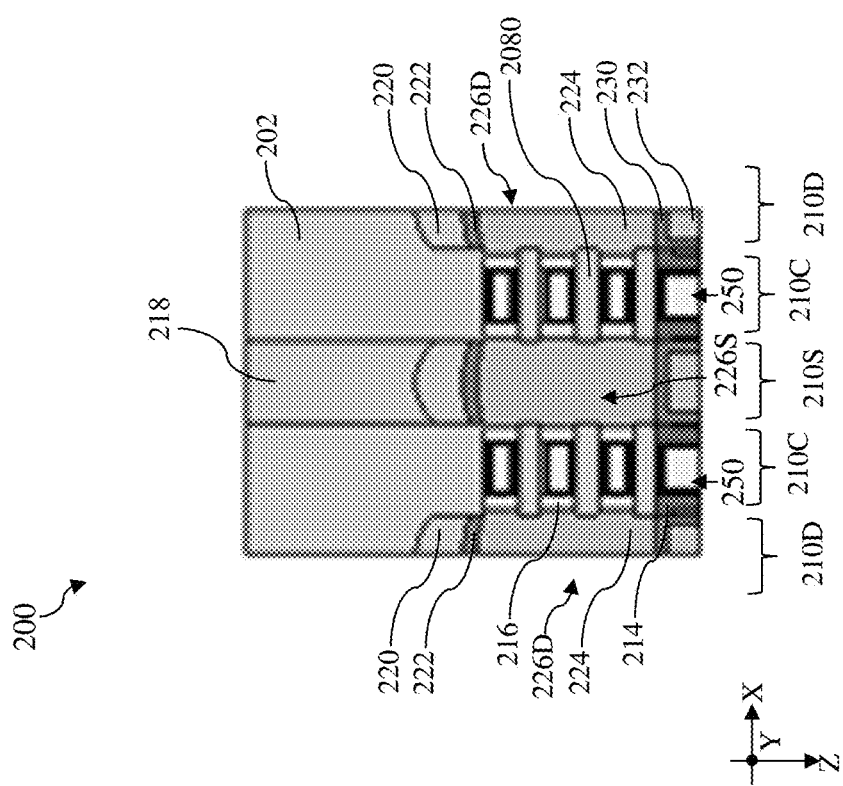
Figure 4A:
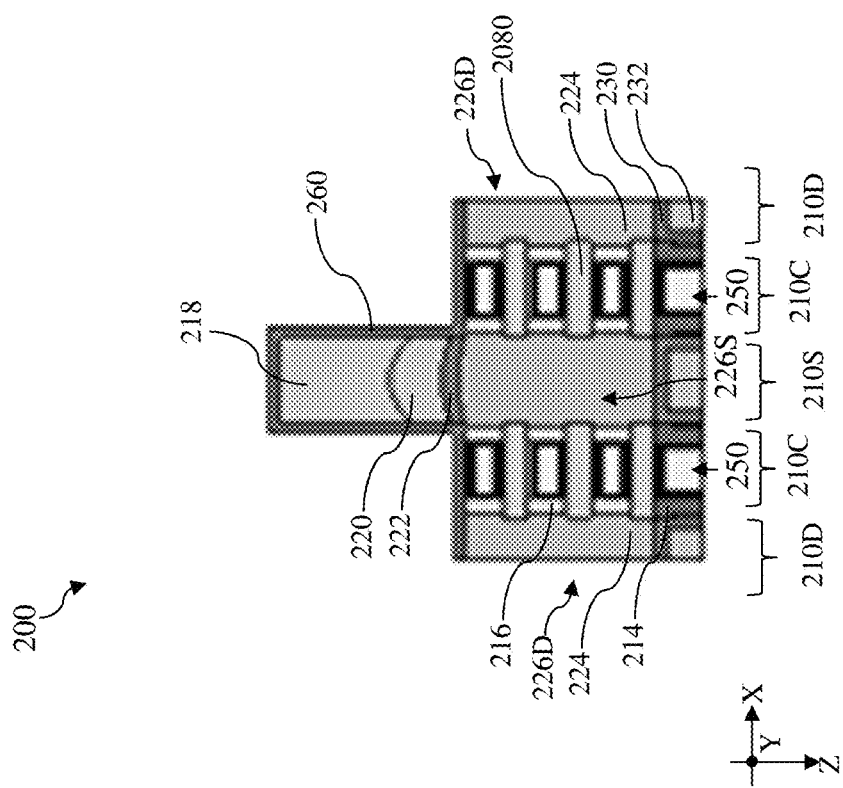
Figure 5A:
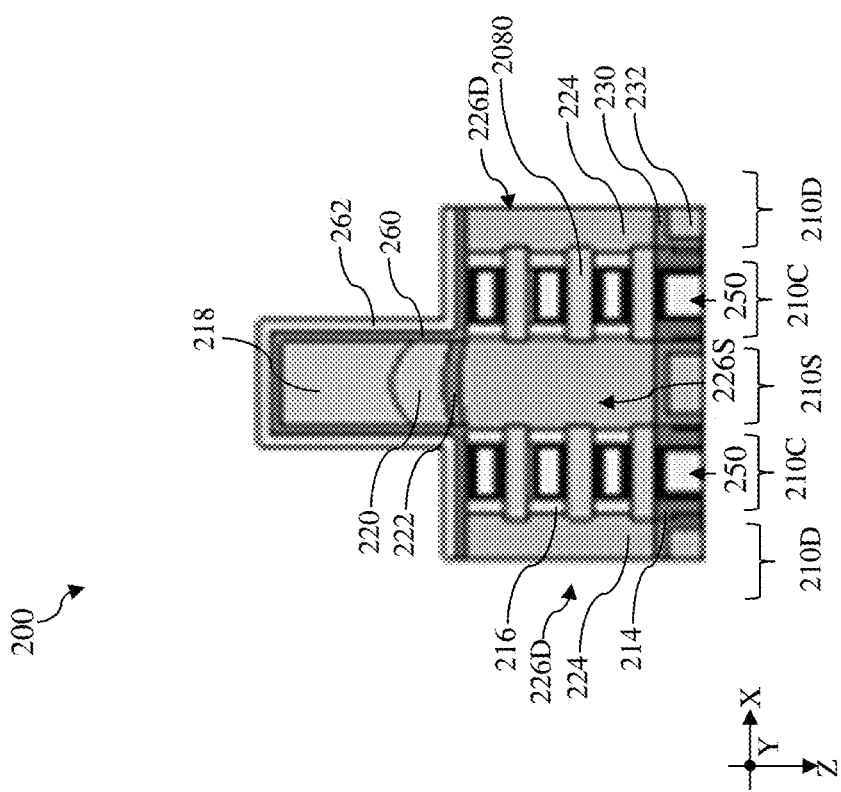

Referring to FIGS. 1, 2 and 2A-2D, method 100 includes a block 102 where a workpiece 200 is received. FIG. 2 illustrates the workpiece 200, with its front side facing up. FIG. 2A illustrates the workpiece 200, with its back side facing up. FIG. 2B illustrates a cross-section of the workpiece 200 across a source region 210S. FIG. 2C illustrates a cross-section of the workpiece 200 across a drain region 210D. FIG. 2D illustrates a cross-section of the workpiece 200 across a channel region 210C. The channel region 210C is disposed between the source region 210S and the drain region 210D along the X direction. Referring to FIG. 2, the workpiece 200 includes a substrate base 202 that may be a portion of a larger substrate that has been partially patterned into a fin-shaped structure. In this regard, the substrate base 202 may be a base portion of such as a fin-shaped structure. In one embodiment, the substrate base 202 includes silicon (Si). In other embodiments, the substrate base 202 may also include other semiconductor materials such as germanium (Ge), silicon carbide (SiC), or silicon germanium (SiGe). Referring to FIGS. 2C and 2D, the substrate base 202 is spaced apart from an adjacent substrate base (not explicitly shown in FIG. 2C or 2D) by an isolation feature 204. In some embodiments, the isolation feature 204 is deposited in trenches that define the substrate base 202. The isolation feature 204 may also be referred to as a shallow trench isolation (STI) feature 204. The isolation feature 204 may include silicon oxide, silicon oxynitride, fluorine-doped silicate glass (FSG), a low-k dielectric, combinations thereof, and/or other suitable materials.

Referring to FIG. 2, the workpiece 200 includes one or more stacks of channel members 2080 disposed over the substrate base 202. Two stacks of channel members 2080 are shown in FIG. 2 but the workpiece 200 may include more stacks of channel members 2080. The channel members 2080 may be formed of a semiconductor material that is similar to the material of the substrate base 202. In one embodiments, the channel members 2080 may include silicon (Si). Each of the channel members 2080 in a stack of the channel members 2080 is wrapped around by a gate structure 250. Two gate structures 250 are shown in FIG. 2 wrapping around two stacks of channel members 2080 but the workpiece 200 may include more gate structures 250. Each of the gate structures 250 may include an interfacial layer, a gate dielectric layer 252 over the interfacial layer and a gate electrode layer over the gate dielectric layer. In some embodiments, the interfacial layer includes silicon oxide. The gate dielectric layer may also be referred to a high-k dielectric layer, as it is formed of a dielectric material having a dielectric constant greater than that of silicon dioxide, which is about 3.9. The gate dielectric layer may include hafnium oxide. Alternatively, the gate dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

The gate electrode layer may include a single layer or alternatively a multilayer structure, such as various combinations of a metal layer with a selected work function to enhance the device performance (work function metal layer), a liner layer, a wetting layer, an first adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

Referring still to FIG. 2, the workpiece 200 includes a gate spacer 214 disposed along sidewalls of the gate structures 250 above the topmost channel member 2080. The gate spacer 214 may be a single layer or a multilayer. In some embodiments, the gate spacer 214 may include silicon oxide, silicon nitride, silicon carbide, silicon oxynitride, silicon carbonitride, silicon oxycarbide, silicon oxycarbonitride, and/or combinations thereof. Between two adjacent channel members 2080, sidewalls of the gate structures are lined by inner spacer features 216. The inner spacer features 216 may include silicon oxide, silicon nitride, silicon oxycarbide, silicon oxycarbonitride, silicon carbonitride, metal nitride, or a suitable dielectric material. Each stack of channel members 2080 extend between a source feature 226S and a drain feature 226D. One end surface of each of the channel members 2080 is coupled to a source feature 226S and the other end surface of each of the channel members 2080 is coupled to a drain feature 226D. Depending on the conductivity type of the to-be-formed MBC transistor, the source feature 226S and the drain feature 226D may be n-type or p-type. When they are n-type, they may include silicon (Si), phosphorus-doped silicon (Si:P), arsenic-doped silicon (Si:As), antimony-doped silicon (Si:Sb), or other suitable material and may be in-situ doped during the epitaxial process by introducing an n-type dopant, such as phosphorus (P), arsenic (As), or antimony (Sb). When they are p-type, they may include germanium (Ge), gallium-doped silicon germanium (SiGe:Ga), boron-doped silicon germanium (SiGe:B), or other suitable material and may be in-situ doped during the epitaxial process by introducing a p-type dopant, such as boron (B) or gallium (Ga). Along the Y direction, the span of the source feature 226S and the drain feature 226D is bound by dielectric fins 208. The dielectric fins 208 may also be referred to as hybrid fins 208, shown in FIGS. 2B and 2C. In some embodiments, each of the dielectric fins 208 includes an outer layer 205, an inner layer 206, and a helmet layer 207. In some embodiments, a dielectric constant of the outer layer 205 or the helmet layer 207 is greater than a dielectric constant of the inner layer 206. The outer layer 205 and the helmet layer 207 may include silicon nitride, silicon oxynitride, silicon carbonitride, silicon carbide, zirconium oxide, hafnium oxide, lanthanum oxide, aluminum oxide, or zinc oxide. The inner layer 206 may include silicon oxide, silicon oxycarbonitride, or a porous material.

In some embodiments represented in FIG. 2, each of the source feature 226S and the drain feature 226D includes a first epitaxial layer 220, a second epitaxial layer 222 over the first epitaxial layer 220, and a third epitaxial layer 224 over the second epitaxial layer 222. In some implementations, the first epitaxial layer 220, the second epitaxial layer 222, and the third epitaxial layer 224 may have different doping concentrations. For example, a doping concentration in the third epitaxial layer 224 may be greater than a doping concentration in the second epitaxial layer 222 and the doping concentration in the second epitaxial layer 222 is greater than a doping concentration of the first epitaxial layer 220. In some instances, the first epitaxial layer may include silicon germanium and may be undoped (not intentionally doped). The increased doping concentration in the third epitaxial layer 224 functions to reduce contact resistance. In some embodiments, composition of the first epitaxial layer 220 and the second epitaxial layer 222 are selected such that the second epitaxial layer 222 may serve as an epitaxial etch stop layer. For example, when an n-type MBC transistor is desired, the first epitaxial layer 220 is formed of silicon germanium (SiGe) and the second epitaxial layer 222 is formed of silicon (Si) doped with an n-type dopant. An etch process that etches silicon germanium may be slowed down when it etches the second epitaxial layer 222 due to the reduction of germanium content. When a p-type MBC transistor is desired, the first epitaxial layer 220 is formed of silicon germanium (SiGe) and the second epitaxial layer 222 is formed of silicon germanium (Si) doped with boron (B). An etch process that etches silicon germanium may be slowed down when it etches the second epitaxial layer 222 as the boron dopant may reduce the etch rate. In some implementations, the first epitaxial layer 220 may be the same for n-type and p-type MBC transistors to ensure substantially similar etch rate in different device regions.

As shown in FIG. 2, the source feature 226S is disposed directly over a semiconductor plug 218. Referring to FIGS. 2 and 2B, the semiconductor plug 218 extends through the substrate base 202 as well as the isolation feature 204 Along the X direction, the semiconductor plug 218 is sandwiched between two portions of the substrate base 202, as illustrated in FIG. 2. Along the Y direction, the semiconductor plug 218 is sandwiched between two portions of the isolation feature 204, as illustrated in FIG. 2B. In some embodiments, the semiconductor plug 218 may be formed of silicon germanium (SiGe). A composition of the semiconductor plug 218 may be similar to that of the first epitaxial layer 220.

The workpiece 200 includes a contact etch stop layer (CESL) 230 disposed over the source feature 226S and the drain feature 226D and a first interlayer dielectric (ILD) layer 232 disposed over the CESL 230. The CESL 230 may include silicon nitride, silicon oxynitride, and/or other materials known in the art. The first ILD layer 232 may include materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials.

Reference is now made to FIG. 2A. At block 102, the workpiece 200 shown in FIG. 2 is flipped over to have its back side facing up. In this up-side-down configuration, the semiconductor plug 218 is disposed over the source feature 226S. As shown in FIGS. 2A-2D, the top surfaces of the substrate base 202, the isolation feature 204 and the semiconductor plug 218 are coplanar as a result of a planarization process, such as a chemical mechanical polishing (CMP) process. Throughout the present disclosure, the relative spatial relationship between two features are with respect to the orientation of the workpiece 200.

Referring to FIGS. 1 and 3A-3D, method 100 includes a block 104 where the substrate base 202 is selectively removed from a back side of the workpiece 200. As described above, the substrate base 202 is surrounded by the semiconductor plug 218 and the isolation feature 204. In some embodiments, the substrate base 202 may be selectively removed by a selective etch process, such as a selective wet etch process or a selective dry etch process. An example selective wet etch process may include use of ethylenediamine pyrocatechol (EDP), tetramethylammonium hydroxide (TMAH), nitric acid ($HNO_3$), hydrofluoric acid (HF), ammonia ($NH_3$), ammonium fluoride ($NH_4F$) or a suitable wet etchant. An example selective dry etch process may include sulfur hexafluoride ($SF_6$), hydrogen ($H_2$), ammonia (NH3), hydrogen fluoride (HF), carbon tetrafluoride (CF$_4$), argon, or a mixture thereof. As shown in FIGS. 3B, 3C and 3D, the selective removal at block 104 does not substantially damage the semiconductor plug 218 or the isolation feature 204. In the drain region 210D shown in FIG. 3C, the removal of the substrate base 202 may result in a backside drain opening 234D that terminates in the third epitaxial layer 224 of the drain feature 226D. In the channel region 210C shown in FIG. 3D, the removal of the substrate base 202 may result in a backside channel opening 234C that terminates at a lower surface of the gate dielectric layer 252.

Referring to FIGS. 1 and 4A-4D, method 100 includes a block 106 where a first liner 260 is deposited over the back side of the workpiece 200. In some embodiments, the first liner 260 may include silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, silicon carbonitride, or a combination thereof. The first liner 260 may be deposited using chemical vapor deposition (CVD), atomic layer deposition (ALD), or a suitable deposition method. In one embodiment, the first liner 260 may include silicon nitride. In some instances, the first liner 260 may be deposited to a thickness between about 2 nm and about 10 nm. As shown in FIGS. 4A-4D, the first liner 260 may be deposited on top surfaces of the semiconductor plug 218, sidewalls of the semiconductor plug 218, sidewalls of the first epitaxial layer 220, sidewalls of the second epitaxial layer 222, sidewalls of the isolation feature 204, surfaces of the third epitaxial layer 224 exposed in the backside drain opening 234D, surfaces of the gate dielectric layer 252 exposed in the backside channel opening 234C.

Referring to FIGS. 1 and 5A-5D, method 100 includes a block 108 where a sacrificial spacer 262 is deposited over the back side of the workpiece 200. A composition of the sacrificial spacer 262 is different from that of the first liner 260 or that of the second liner 264 (to be described below). In some embodiments, the sacrificial spacer 262 may include a silicon-containing material that is not an oxide or a nitride. This arrangement allows the sacrificial spacer 262 to be selectively removed without substantially damaging the first liner 260 and the second liner 264 (to be described below). For example, the sacrificial spacer 262 may include silicon (Si), silicon germanium (SiGe), or silicon carbide (SiC). In one embodiment, the sacrificial spacer 262 is formed of silicon (Si). The sacrificial spacer 262 may be deposited using chemical vapor deposition (CVD), atomic layer deposition (ALD), or a suitable deposition method. In some instances, the sacrificial spacer 262 may be deposited to a thickness between about 2 nm and about 10 nm. As shown in FIGS. 5A-5D, the sacrificial spacer 262 may be deposited conformally on the first liner 260. The sacrificial spacer 262 may also be referred to as a sacrificial liner 262.

Figure 6A:
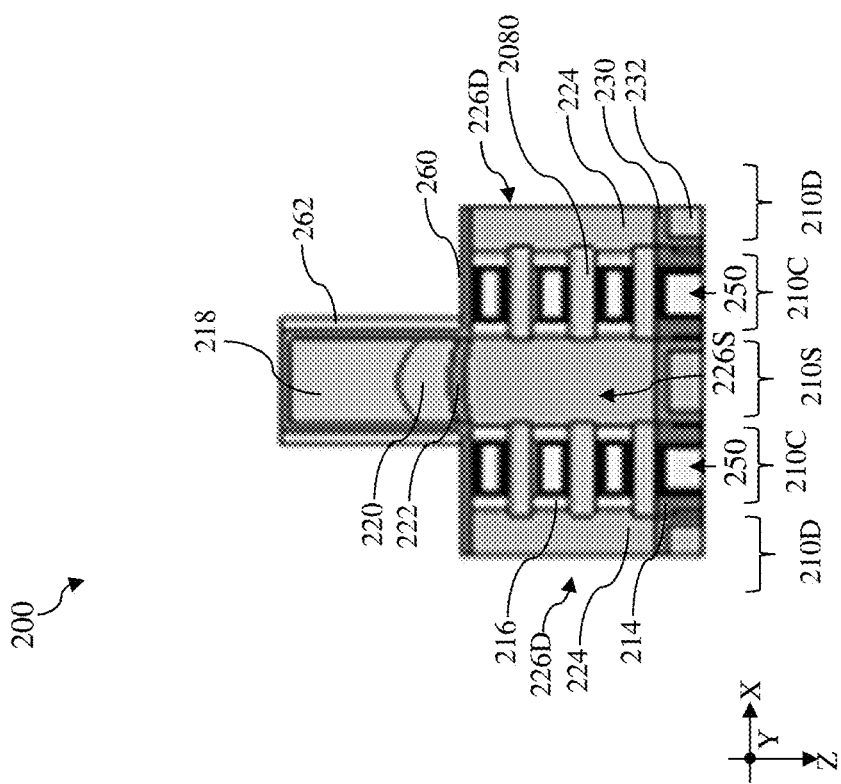
Figure 7A:
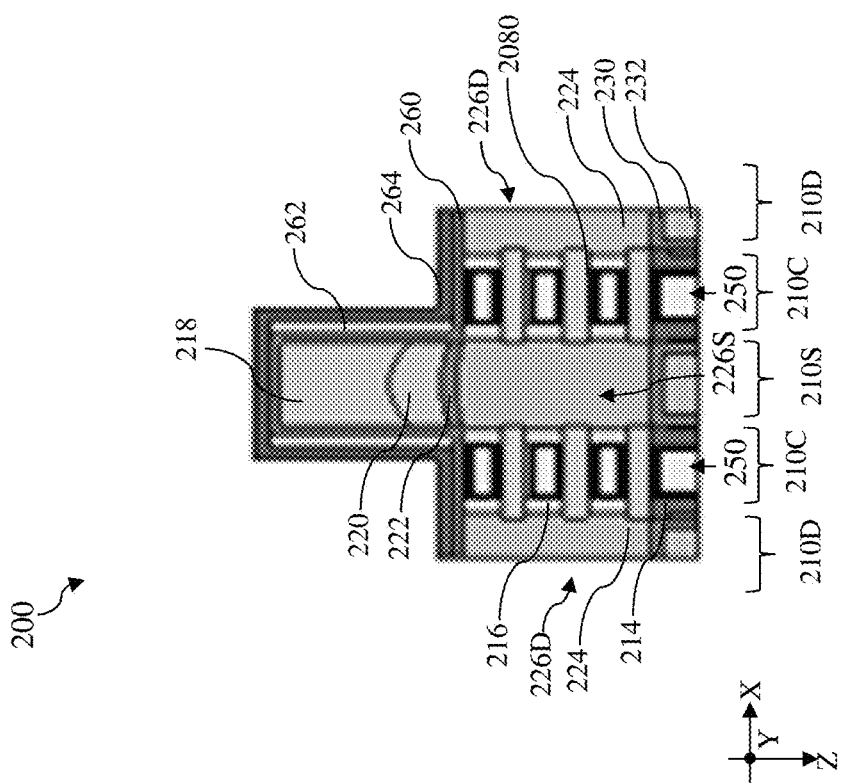
Figure 8A:
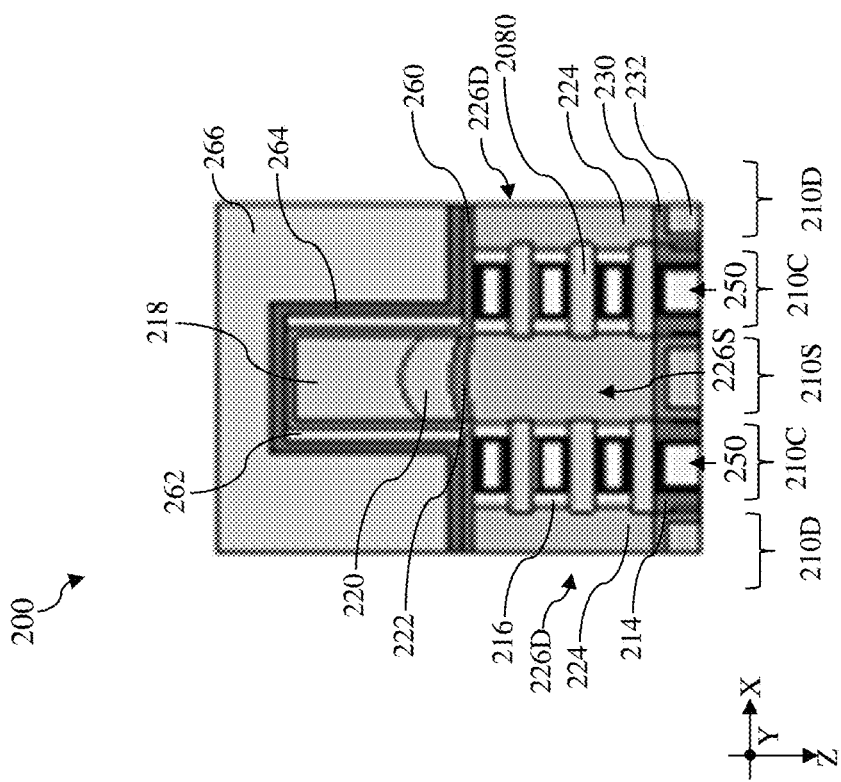

Referring to FIGS. 1 and 6A-6D, method 100 includes a block 110 where the sacrificial spacer 262 is etched back. In some embodiments, an anisotropic etch process may be performed at block 110 to remove the sacrificial spacer 262 from all top-facing surfaces. In some instances, the anisotropic etch process may include use of an oxygen-containing gas, hydrogen, a fluorine-containing gas (e.g., NF$_3$, CF$_4$, SF$_6$, CH$_2$F$_2$, CHF$_3$, and/or C$_2$F$_6$), a chlorine-containing gas (e.g., Cl$_2$, CHCl$_3$, CCl$_4$, and/or BCl$_3$), a bromine-containing gas (e.g., HBr and/or CHBR$_3$), an iodine-containing gas, other suitable gases and/or plasmas, and/or combinations thereof. As shown in FIG. 6A, after the etch back process at block 110, the sacrificial spacer 262 remains on sidewalls of the semiconductor plug 218. As illustrated in FIGS. 6C and 6D, the etch back process at block 110 leaves behind the sacrificial spacer 262 on sidewalls of the isolation feature 204 in the backside drain opening 234D and the backside channel opening 234C. It is noted that if the sacrificial spacer 262 over the channel regions 210C and the drain regions 210D is not removed, the subsequent removal of the sacrificial spacer 262 may have inferior structural integrity.

Referring to FIGS. 1 and 7A-7D, method 100 includes a block 112 where a second liner 264 is deposited over the back side of the workpiece 200. A composition of the second liner 264 may be different from that of the sacrificial spacer 262 but may be similar to that of the first liner 260. In some embodiments, the second liner 264 may include silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, silicon carbonitride, or a combination thereof. The second liner 264 may be deposited using chemical vapor deposition (CVD), atomic layer deposition (ALD), or a suitable deposition method. In some instances, the second liner 264 may be deposited to a thickness between about 2 nm and about 10 nm. As shown in FIGS. 7A-7D, the second liner 264 are in contact with both the first liner 260 and the sacrificial spacer 262. The second liner 264 interfaces the first liner 260 on horizontal surfaces that are free of the sacrificial spacer 262. The second liner 264 also engages the sacrificial spacer 262 on vertical surfaces where the sacrificial spacer 262 is not removed during the etch back at block 110.

Referring to FIGS. 1 and 8A-8D, method 100 includes a block 114 where a backside dielectric layer 266 is deposited over the back side of the workpiece 200. After the second liner 264 is deposited over the back side of the workpiece 200, the backside dielectric layer 266 may be deposited over a back side of the workpiece 200 by flowable CVD (FCVD), CVD, plasma-enhanced CVD (PECVD), spin-on coating, or a suitable process. The backside dielectric layer 266 may include silicon oxide or a composition similar to that of the first ILD layer 232. Depending on the Y-direction width of the backside drain opening 234D or the backside channel opening 234C (shown in FIGS. 3C and 3D), the backside dielectric layer 266 may or may not extend into the second liner 264. When the first liner 260, the sacrificial spacer 262, and the second liner 264 do not completely fill the backside drain opening 234D or the backside channel opening 234C, a portion of the backside dielectric layer 266 may extend into the second liner 264. When the first liner 260, the sacrificial spacer 262, and the second liner 264 completely fill the backside drain opening 234D or the backside channel opening 234C, the backside dielectric layer 266 may be disposed on the second liner 264.

Figure 9A:
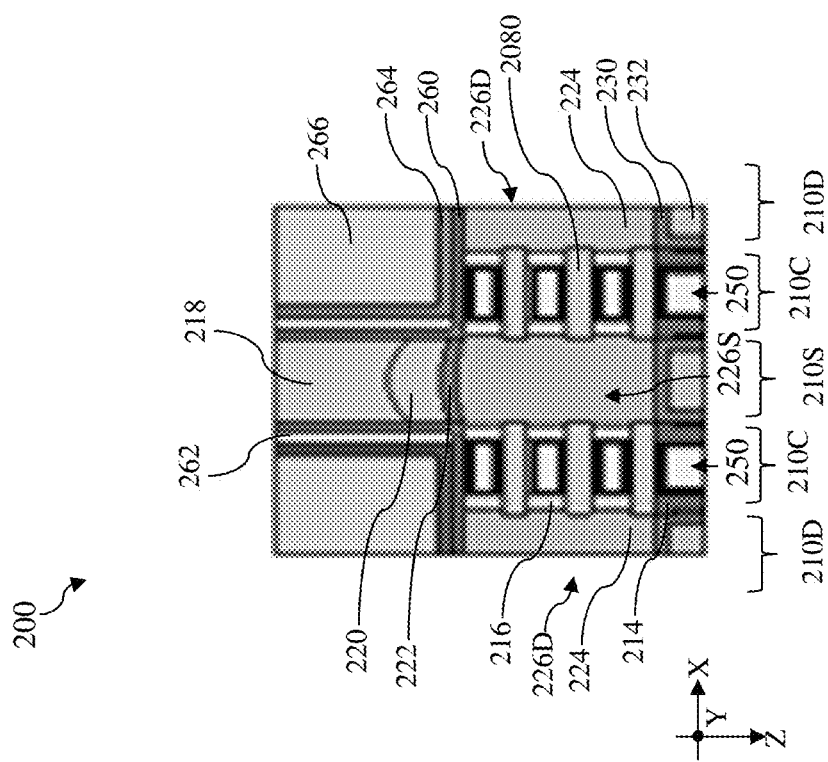

Referring to FIGS. 1 and 9A-9D, method 100 includes a block 116 where the back side of the workpiece 200 is planarized. After the formation of the backside dielectric layer 266, the back side of the workpiece 200 is planarized by a CMP process until the sacrificial spacer 262 is exposed on the back side of the workpiece 200. As shown in FIGS. 9C and 9D, the sacrificial spacer 262 is exposed in the drain region 210D (directly over the drain feature 226D) and the channel region 210C (directly over the gate structure 250). However, as shown in FIG. 9B, the sacrificial spacer 262 is absent from the source region 210S as it is covered by the semiconductor plug 218.

Figure 10A:
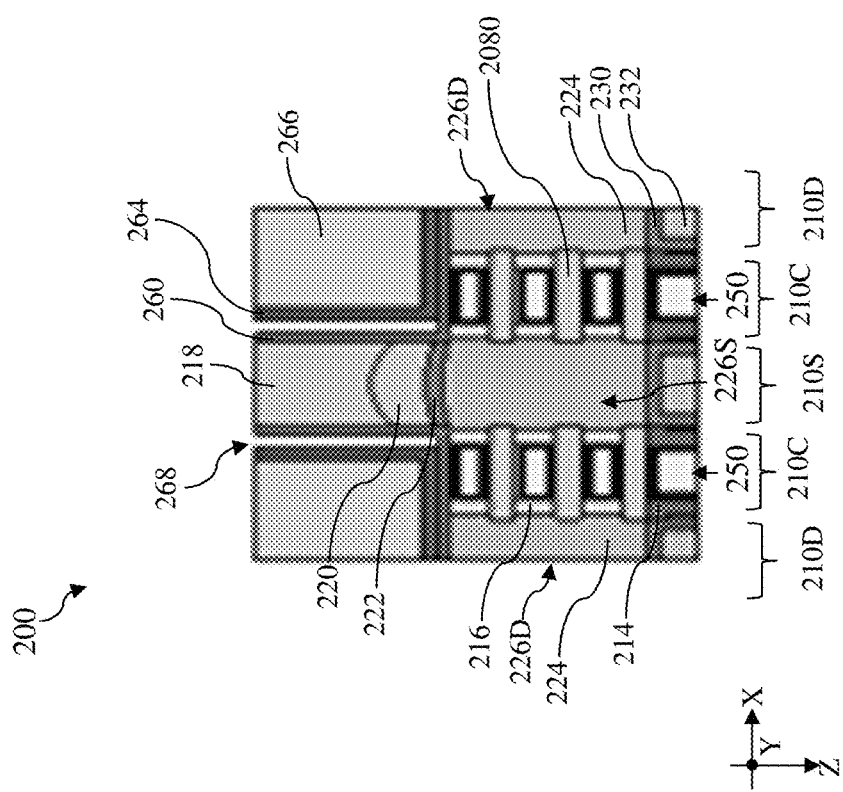
Figure 11A:
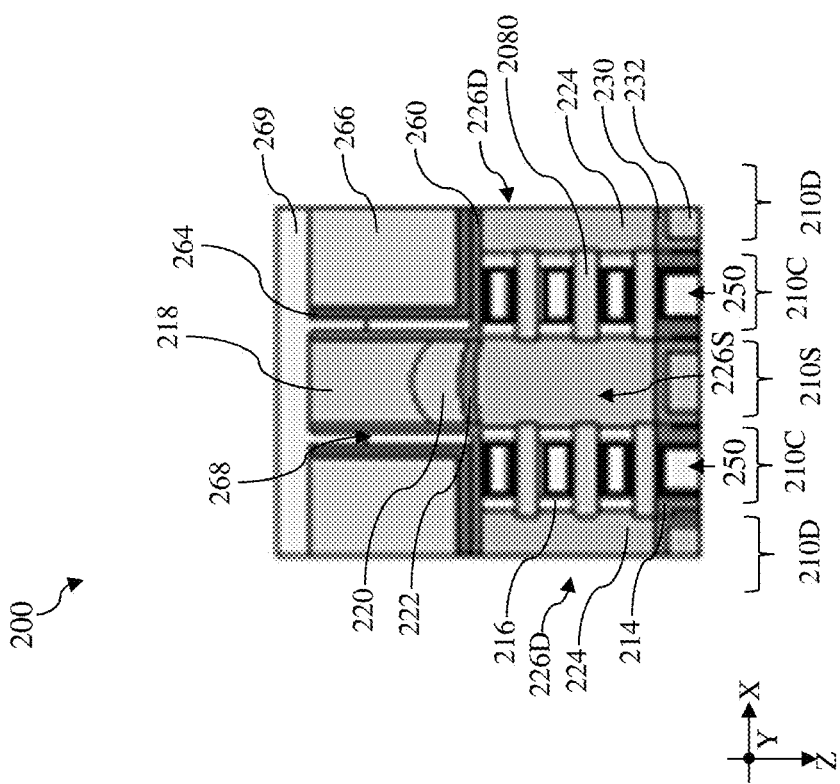

Referring to FIGS. 1 and 10A-10D, method 100 includes a block 118 where the sacrificial spacer 262 is selectively removed to form a trench 268. After the sacrificial spacer 262 is exposed by the planarization process at block 116, the exposed sacrificial spacer 262 may be selectively removed using a selective wet etch process or a selective dry etch process. For example, when the sacrificial spacer 262 is formed of silicon oxide, a suitable selective wet etch process may include diluted hydrofluoric acid (DHF) or buffered hydrofluoric acid (BHF) (i.e., a mixture of ammonium fluoride and hydrofluoric acid) and a suitable selective dry etch process may include use of carbon tetrafluoride ($CF_4$), sulfur hexafluoride ($SF_6$), or nitrogen trifluoride ($NF_3$). When the sacrificial spacer 262 is formed of silicon (Si), a suitable selective wet etch process may include use of ethylenediamine pyrocatechol (EDP), tetramethylammonium hydroxide (TMAH), nitric acid ($HNO_3$), hydrofluoric acid (HF), ammonia ($NH_3$), ammonium fluoride ($NH_4F$) or a suitable wet etchant and a suitable selective dry etch process may include sulfur hexafluoride ($SF_6$), hydrogen ($H_2$), ammonia ($NH_3$), hydrogen fluoride (HF), carbon tetrafluoride ($CF_4$), argon, or a mixture thereof. As shown in FIGS. 10A, 10C and 10D, the removal of the sacrificial spacer 262 results in a trench 268. The trench 268 tracks the sidewall of the second liner 264 that extends from the channel region 210C to the drain region 210D. Referring to FIG. 10A, a portion of the trench 268 is sandwiched between the first liner 260 and the second liner 264 along the X direction. That portion of the trench 268 is also disposed between the isolation feature 204 and the semiconductor plug 218 along the X direction. As shown in FIG. 10B, because the sacrificial spacer 262 does not extend into the source region 210S, the trench 268 also steer clear from the source region 210S. Referring to FIGS. 10C and 10D, the same cannot be said for the drain region 210D and the channel region 210C. In the drain region 210D and the channel region 210C, a portion of the sacrificial spacer 262 extends between the second liner 264 and the first liner 260 along the Y direction.

Figure 12A:
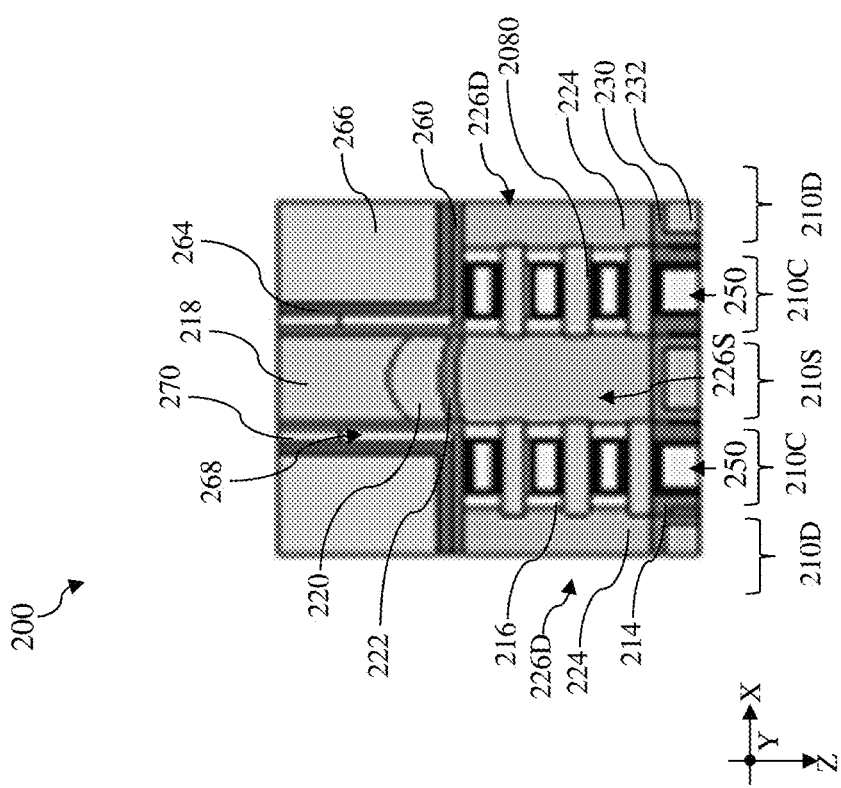

Referring to FIGS. 1, 11A-11D, and 12A-12D, method 100 includes a block 120 where a seal plug 270 is formed to seal the trench 268. Referring to FIGS. 11A-11D, after the formation of the trench 268, a seal material 269 is deposited over a back side of the workpiece 200, including over the isolation feature 204, the first liner 260, the trench 268, the second liner 264, the semiconductor plug 218. In some embodiments, the seal material 269 may include silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, silicon carbonitride, or a combination thereof. In some implementations, the seal material 269 may be deposited using CVD, ALD, or both. In one embodiment, the seal material 269 is deposited using a combination of ALD and CVD. Deposition of the seal material 269 by ALD ensures some penetration of the seal material 269 into the trench 268 and the CVD that follows increases the overall thickness of the seal material 269. If little of no seal material 269 is deposited into the trench 268, the subsequent planarization process may remove all of the seal material 269, which is unsatisfactory in some cases. After the seal material 269 is deposited, the workpiece 200 is planarized to remove excess seal material 269 on the backside surfaces of the isolation feature 204 and the backside dielectric layer 266. As a result, seal plugs 270 are formed to plug the trench 268. The plugged trench 268 may also be referred to as a gap 268. As shown in FIGS. 12C and 12D, the gap 268 tracks the sidewalls of the first liner 260 and the second liner 264 and extends over the drain feature 226D and the gate structure 250. The gap 268 may or may not include gaseous species. When the gap 268 includes gaseous species, it may also be referred to as an air gap 268. Such gaseous species may be remnants of inert or unreacted gaseous species present during the deposition of the seal material 269.

Figure 13A:
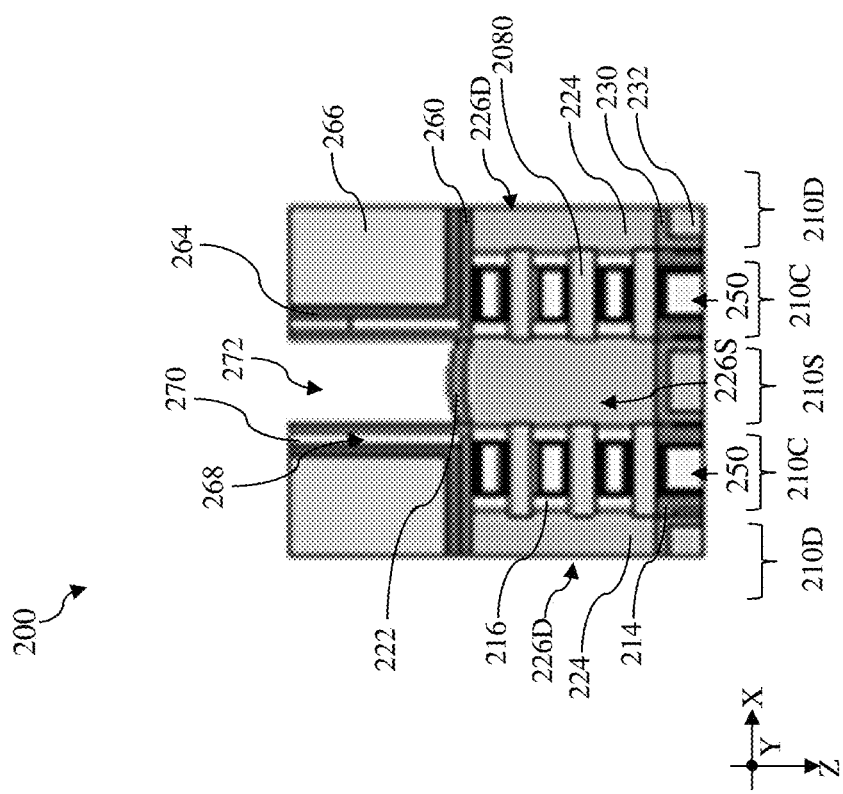

Referring to FIGS. 1 and 13A-13D, method 100 includes a block 122 where the semiconductor plug 218 is removed to form a backside contact opening 272. In some embodiments, the removal of the semiconductor plug 218 may be self-aligned because the semiconductor plug 218, which is formed of a semiconductor material, is disposed among the isolation feature 204, the first liner 260, the second liner 264, the seal plug 270, and the backside dielectric layer 266, all of which are formed dielectric materials. In these embodiments, the selective removal of the semiconductor plug 218 may be performed using a selective wet etch process. An example selective wet etch process may include use of a solution of ammonium hydroxide ($NH_4OH$) and hydrogen peroxide ($H_2O_2$). Because the selective etch process at block 122 etches the semiconductor plug 218 faster than it etches the isolation feature 204, the first liner 260, the second liner 264, the seal plug 270, and the backside dielectric layer 266, the semiconductor plug 218 may be removed without little or no damages to adjacent structures. As shown in FIGS. 13A and 13B, at block 122, both the semiconductor plug 218 and the first epitaxial layer 220 are selectively removed to expose the second epitaxial layer 222 of the source feature 226S in a backside contact opening 272. As described above, the built-in etch selectivity allows etch termination on the second epitaxial layer 222. The backside contact opening 272 provides access to the source feature 226S from the back side of the workpiece 200.

Figure 14A:
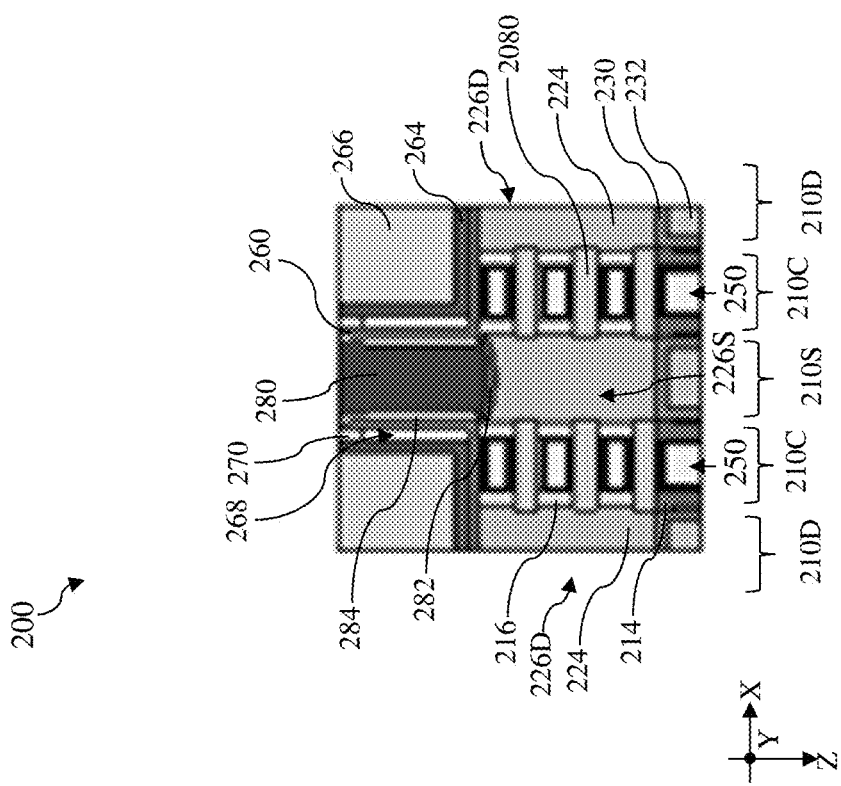

Referring to FIGS. 1 and 14A-14D, method 100 includes a block 124 where a backside contact 280 is formed in the backside contact opening 272. In some embodiments, the backside contact 280 interfaces the source feature 226S via a silicide layer 282 and is spaced apart from the isolation feature 204 by a third liner 284. In an example process, after the backside contact opening 272 is formed at block 122, the third liner 284 is deposited using CVD or ALD over the back side of the workpiece 200, including over the backside contact opening 272. The third liner 284 may have a composition similar to that of the first liner 260 or the second liner 264. In some implementations, the third liner 284 include silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, silicon carbonitride, or a combination thereof. In one embodiment, the third liner 284 may include silicon nitride. Then the deposited third liner 284 is etched back to expose the second epitaxial layer 222 of the source feature 226S. The third liner 284 functions to prevent oxygen diffusion from the isolation feature 204 into the backside contact 280. With reference to FIG. 14A, the third liner 284 increases the separation between the backside contact 280 (or edges thereof) and the adjacent gate structures 250. In that regard, the third liner 284 functions to prevent source-gate leakage and improve yield.

After the second epitaxial layer 222 of the source feature 226S is exposed, a metal precursor is deposited by PVD or CVD over the second epitaxial layer 222 and an anneal process is performed to bring about a silicidation reaction between the second epitaxial layer 222 and the metal precursor. When the source feature 226S is n-type, a suitable metal precursor may include titanium (Ti), chromium (Cr), tantalum (Ta), molybdenum (Mo), zirconium (Zr), hafnium (Hf), scandium (Sc), yttrium (Y), holmium (Ho), terbium (Tb), gadolinium (Gd), lutetium (Lu), dysprosium (Dy), erbium (Er), or ytterbium (Yb). When the source feature 226S is p-type, a suitable metal precursor may include nickel (Ni), cobalt (Co), manganese (Mn), tungsten (W), iron (Fe), rhodium (Rh), palladium (Pd), ruthenium (Ru), platinum (Pt), iridium (Ir), or osmium (Os). When the source feature 226S is n-type, the silicide layer 282 may include titanium silicide (TiSi), chromium silicide (CrSi), tantalum silicide (TaSi), molybdenum silicide (MoSi), zirconium silicide (ZrSi), hafnium silicide (HfSi), scandium silicide (ScSi), yttrium silicide (YSi), holmium silicide (HoSi), terbium silicide (TbSi), gadolinium silicide (GdSi), lutetium silicide (LuSi), dysprosium silicide (DySi), erbium silicide (ErSi), or ytterbium silicide (YbSi). When the source feature 226S is p-type, the silicide layer 282 may include nickel silicide (NiSi), cobalt silicide (CoSi), manganese silicide (MnSi), tungsten silicide (WSi), iron silide (FeSi), rhodium silicide (RhSi), palladium silicide (PdSi), ruthenium silicide (RuSi), platinum silicide (PtSi), iridium silicide (IrSi), or osmium silicide (OsSi). In some instances, the silicide layer 282 may have a thickness between about 1 nm and about 10 nm. In some embodiments, the metal precursor that does not form the silicide layer 282 may be removed.

After the formation of the third liner 284 and the silicide layer 282, a metal fill material may be deposited into the backside contact opening 272 to form the backside contact 280, as shown in FIGS. 14A and 14B. The metal fill material may include tungsten (W), ruthenium (Ru), cobalt (Co), copper (Cu), titanium (Ti), titanium nitride (TiN), tantalum (Ta), tantalum nitride (TaN), molybdenum (Mo), or nickel (Ni). A planarization process, such as a CMP process, may follow to remove excess materials and provide a planar top surface. The backside contact 280 is electrically coupled to the source feature 226S.

Referring to FIG. 1, method 100 includes a block 126 where further processes are performed. While not explicitly shown, such further processes may include formation of a backside power rail. The backside power rail may be embedded in an insulation layer. The insulation layer may have a composition similar to the first ILD layer 232 and may be deposited over the back side of the workpiece 200, including over the backside dielectric layer 266, the first liner 260, the second liner 264, the seal plug 270, the third liner 284, the isolation feature 204, and the backside contact 280, using spin-on coating, FCVD, or CVD. Then, a power rail trench may be patterned in the insulation layer. A barrier layer and a metal fill material are then deposited into the power rail trench to form the backside power rail. In some embodiments, the barrier layer in the backside power rail may include titanium nitride, tantalum nitride, cobalt nitride, nickel nitride, or tungsten nitride and the metal fill material in the backside power rail may include titanium (Ti), ruthenium (Ru), copper (Cu), nickel (Ni), cobalt (Co), tungsten (W), tantalum (Ta), or molybdenum (Mo). The barrier layer and the metal fill layer may be deposited using PVD, CVD, ALD, or electroless plating. A planarization process, such as a CMP process, may be performed to remove excess materials over the insulation layer. The backside power rail is in direct contact with and electrically coupled to the backside contact 280.

Figure 15:
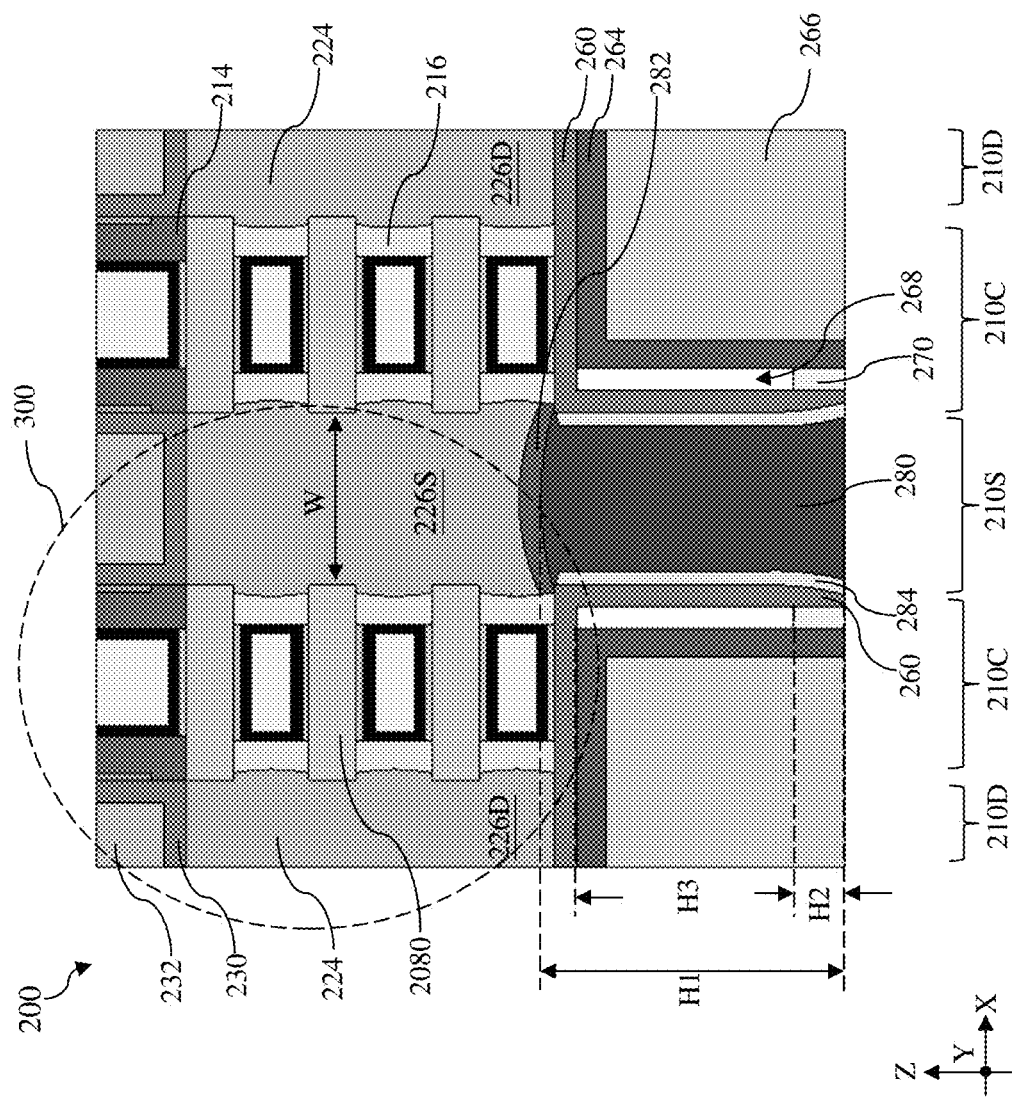

FIG. 15 illustrate the workpiece 200 in FIG. 14A in an upright orientation where the back side of the workpiece 200 faces down. The workpiece 200 includes an MBC transistor 300. The MBC transistor 300 includes the drain feature 226D disposed over the backside dielectric layer 266 and the source feature 226S disposed over the backside contact 280. The MBC transistor 300 also includes a vertical stack of channel members 2080 that extend between the drain feature 226D and the source feature 226S along the X direction. The source feature 226S or the drain feature 226D may include a width W along the X direction. In some instances, the width W may be between about 10 nm and about 30 nm. The backside contact 280 may include a first height H1. In some instances, the first height H1 may be between about 5 nm and about 30 nm. The backside contact 280 is spaced apart from the backside dielectric layer 266 by the second liner 264, the gap 268, the first liner 260, and the third liner 284. A bottom portion of the backside contact 280 is spaced apart from the backside dielectric layer 266 by the second liner 264, the seal plug 270, the first liner 260, and the third liner 284. The backside dielectric layer 266 is spaced apart from the gate structure 250 or the drain feature 226D by the horizontal portions of the first liner 260 and the second liner 264. The seal plug 270 may include a second height H2. In some instances, the second height H2 may be between about 5 nm and about 15 nm. The gap 268 may include a third height H3 measured from a horizontal portion of the first liner 260 to a bottom surface of the seal plug 270. In some instances, the third height H3 may be between about 15 nm and about 25 nm. A width of the gap 268 generally corresponds to the thickness of the sacrificial spacer 262. In some instances, the width of the gap 268 may be between about 2 nm and about 10 nm. Referring to FIGS. 14C, 14D and 15, in the up-right position shown in FIG. 15, the gap 268 extends directly below the drain feature 226D in the drain region 210D and the gate structure 250 in the channel region 210C.

Embodiments of the present disclosure provide advantages. Methods of the present disclosure form a gap disposed between a backside contact and a backside dielectric layer. The gap is defined between two liners. Because a dielectric constant of the gap is low (1 if the gap includes a vacuum or about 1 if the gap includes a gaseous species), the presence of the gap reduces the parasitic capacitance between the backside contact and an adjacent gate structure.

In one exemplary aspect, the present disclosure is directed to a semiconductor device. The semiconductor device includes a source feature disposed over a backside source contact, a drain feature disposed over a backside dielectric layer, a plurality of channel members each extending between the source feature and the drain feature, and a gate structure wrapping around each of the plurality of channel members, the gate structure being disposed over the backside dielectric layer. The backside source contact is spaced apart from the backside dielectric layer by a gap.

In some embodiments, the semiconductor device may further include a first liner and a second liner disposed between the backside dielectric layer and the drain feature and the first liner is in contact with the drain feature and the second liner is spaced apart from the drain feature by the first liner. In some implementations, the first liner and the second liner extend between the gate structure and the backside dielectric layer. In some instances, the first liner and the second liner include silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, silicon carbonitride. In some implementations, the first liner includes a first vertical portion that extends along a sidewall of the backside source contact and the second liner includes a second vertical portion that extends along a sidewall of the backside dielectric layer. In some embodiments, the semiconductor device may further include a third liner disposed between the first vertical portion of the first liner and the backside source contact. In some embodiments, the gap is disposed between the first vertical portion of the first liner and the second vertical portion of the second liner. In some embodiments, the semiconductor device may further include a seal plug disposed between the first vertical portion and the second vertical portion. The gap is disposed in a space defined by the first vertical portion, the second vertical portion, and the seal plug.

In another exemplary aspect, the present disclosure is directed to a semiconductor structure. The semiconductor structure includes a backside source contact, a source feature disposed over the backside source contact, a contact etch stop layer disposed over the source feature, a first liner extending along sidewalls of the backside source contact, a second liner extending along the first liner, and a gap disposed between the first liner and the second liner.

In some embodiments, the semiconductor structure may further include a drain feature, a plurality of channel members each extending between the source feature and the drain feature, and a gate structure wrapping around each of the plurality of channel members. The drain feature and the gate structure are disposed over a backside dielectric layer. In some implementations, a portion of the first liner and a portion of the second liner extend between the gate structure and the backside dielectric layer as well as between the drain feature and the backside dielectric layer. In some instances, the backside source contact is spaced apart from the backside dielectric layer by the first liner, the second liner, and the gap. In some embodiments, the gap extends below the gate structure. In some instances, the gap extends below the drain feature. In some instances, the semiconductor structure may further include a third liner disposed between the first liner and the backside source contact. The third liner includes silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, silicon carbonitride, or a combination thereof.

In yet another exemplary aspect, the present disclosure is directed to a method. The method includes receiving a workpiece that includes a plurality of channel members disposed over a substrate, a gate structure wrapping around each of the plurality of channel members, and a source feature disposed over a semiconductor plug extending into the substrate, the source feature being coupled to the plurality of channel members, selectively removing the substrate without substantially damaging the semiconductor plug, after the selectively removing, depositing a first liner over the semiconductor plug, depositing a sacrificial liner over the first liner, depositing a second liner over the sacrificial liner, depositing a backside dielectric layer over the second liner, performing a planarization process to expose the sacrificial liner, and after the planarization process, selectively removing the exposed sacrificial liner to form a gap between the first liner and the second liner.

In some embodiments, a composition of the first liner is different from a composition of the sacrificial liner and a composition of the second liner is different from the composition of the sacrificial liner. In some embodiments, the sacrificial liner includes silicon. In some embodiments, the method may further include after the depositing of the sacrificial liner and before the depositing of the second liner, etching back the sacrificial liner. In some instances, the method may further include after the selectively removing of the exposed sacrificial liner, depositing a seal material over the gap, and planarizing the seal material to form a seal plug over the gap.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first source/drain feature and a second source/drain feature;
   a vertical stack of nanostructures sandwiched between the first source/drain feature and the second source/drain feature along a direction;
   a backside contact disposed below and electrically coupled to the second source/drain feature;
   a first liner comprising:
      a first horizontal portion extending horizontally under the first source/drain feature and the vertical stack of nanostructures, and
      a first vertical portion extending along a sidewall of the backside contact; and
   a second liner disposed under the first liner, the second liner comprising:
      a second horizontal portion extending horizontally under the first source/drain feature and the vertical stack of nanostructures, and
      a second vertical portion extending along the sidewall of the backside contact,
   wherein the first vertical portion of the first liner and the second vertical portion of the second liner define a gap along the direction.

2. The semiconductor structure of claim 1, further comprising:
   a seal plug disposed between the first vertical portion of the first liner and a second vertical portion of the second liner.

3. The semiconductor structure of claim 1, wherein the first liner and the second liner comprise silicon nitride.

4. The semiconductor structure of claim 1, wherein the first horizontal portion of the first liner is in contact with the first source/drain feature.

5. The semiconductor structure of claim 1, wherein the first horizontal portion of the first liner is in contact with the second horizontal portion of the second liner.

6. The semiconductor structure of claim 1, further comprising:
a gate structure wrapping around each of the vertical stack of nanostructures,
wherein the gate structure is spacer apart from the first source/drain feature and the second source/drain feature by a plurality of inner spacer features,
wherein a bottommost inner spacer feature of the plurality of inner spacer features is in direct contact with the first horizontal portion of the first liner.

7. The semiconductor structure of claim 6, wherein a bottom surface of the gate structure is contact with the first horizontal portion of the first liner.

8. The semiconductor structure of claim 1, wherein the backside contact is spaced apart from the first vertical portion of the first liner by a third liner.

9. A semiconductor structure, comprising:
a plurality of nano structures;
a source feature and a drain feature sandwiching the plurality of nanostructures along a first direction;
a backside contact disposed below and electrically coupled to the source feature; and
a liner comprising:
  a horizontal portion extending horizontally under the drain feature and the plurality of nano structures, and
  a vertical portion extending along a sidewall of the backside contact, wherein the backside contact is spaced apart from the vertical portion by a gap.

10. The semiconductor structure of claim 9, wherein the source feature is disposed between a first dielectric fin and a second dielectric fin along a second direction perpendicular to the first direction.

11. The semiconductor structure of claim 10, wherein each of the first dielectric fin and the second dielectric fin comprises an outer layer, an inner layer disposed within the outer layer, and a helmet layer disposed over top surfaces of the outer layer and the inner layer.

12. The semiconductor structure of claim 11,
wherein the outer layer and the helmet layer comprise silicon nitride, silicon oxynitride, silicon carbonitride, silicon carbide, zirconium oxide, hafnium oxide, lanthanum oxide, aluminum oxide, or zinc oxide,
wherein the inner layer comprises silicon oxide, silicon oxycarbonitride, or a porous material.

13. The semiconductor structure of claim 10, further comprising:
a gate structure wrapping around each of the plurality of nanostructures,
wherein the gate structure is disposed between the first dielectric fin and the second dielectric fin along the second direction.

14. The semiconductor structure of claim 13,
wherein the first dielectric fin is disposed over a first portion of an isolation feature,
wherein the second dielectric fin are disposed over a second portion of the isolation feature,
wherein the gate structure is in contact with the first portion and the second portion of the isolation feature.

15. The semiconductor structure of claim 14, wherein a portion of the liner extends between the first portion and the second portion of the isolation feature.

16. The semiconductor structure of claim 14, wherein a portion of the gap extends between the first portion and the second portion of the isolation feature.

17. A method, comprising:
receiving a workpiece comprising:
  a first stack of nanostructures and a second stack of nanostructures disposed over a substrate,
  a first gate structure wrapping around each of the first stack of nano structures,
  a second gate structure wrapping around each of the second stack of nano structures, and
  a source feature disposed over a semiconductor plug extending into the substrate, the source feature being sandwiched between the first stack of nanostructures and the second stack of nanostructures;
selectively removing the substrate without substantially damaging the semiconductor plug;
after the selectively removing, depositing a first liner over the semiconductor plug;
depositing a sacrificial liner over the first liner;
depositing a second liner over the sacrificial liner;
depositing a backside dielectric layer over the second liner;
performing a planarization process to expose the sacrificial liner; and
after the planarization process, selectively removing the exposed sacrificial liner to form a gap between the first liner and the second liner.

18. The method of claim 17,
wherein the sacrificial liner comprises silicon, silicon germanium, or silicon carbide,
wherein the first liner and the second liner comprise silicon nitride.

19. The method of claim 17, wherein the source feature comprises:
a first epitaxial layer over the semiconductor plug;
a second epitaxial layer over the first epitaxial layer; and
a third epitaxial layer over the second epitaxial layer,
wherein the first epitaxial layer comprises undoped silicon germanium, wherein a germanium content of the second epitaxial layer is smaller than a germanium content of the first epitaxial layer.

20. The method of claim 17, further comprising:
after the selectively removing of the exposed sacrificial liner, depositing a seal material over the gap; and
planarizing the seal material to form a seal plug over the gap.

* * * * *